(12) United States Patent
Miyakawa et al.

(10) Patent No.: US 8,323,855 B2
(45) Date of Patent: Dec. 4, 2012

(54) PELLICLE FRAME APPARATUS, MASK, EXPOSING METHOD, EXPOSURE APPARATUS, AND DEVICE FABRICATING METHOD

(75) Inventors: Tomoki Miyakawa, Kumagaya (JP); Hiromitsu Yoshimoto, Saitama (JP)

(73) Assignee: Nikon Corporation, Tokyo (JP)

( * ) Notice: Subject to any disclaimer, the term of this patent is extended or adjusted under 35 U.S.C. 154(b) by 19 days.

(21) Appl. No.: 12/073,120

(22) Filed: Feb. 29, 2008

(65) Prior Publication Data

US 2008/0213679 A1  Sep. 4, 2008

Related U.S. Application Data

(60) Provisional application No. 60/905,592, filed on Mar. 8, 2007.

(30) Foreign Application Priority Data

Mar. 1, 2007  (JP) ................ 2007-051300

(51) Int. Cl.
*G03F 1/00* (2012.01)
*G03C 5/00* (2006.01)
(52) U.S. Cl. ................ 430/5; 430/311; 430/394
(58) Field of Classification Search ........ 430/5; 355/32, 355/50
See application file for complete search history.

(56) References Cited

U.S. PATENT DOCUMENTS

| | | | |
|---|---|---|---|
| 4,833,051 A | 5/1989 | Imamura | |
| 5,825,043 A | 10/1998 | Suwa | |
| 5,969,441 A | 10/1999 | Loopstra et al. | |
| 6,208,407 B1 | 3/2001 | Loopstra | |
| 6,341,007 B1 | 1/2002 | Nishi et al. | |
| 6,400,441 B1 | 6/2002 | Nishi et al. | |
| 6,549,269 B1 | 4/2003 | Nishi et al. | |
| 6,590,634 B1 | 7/2003 | Nishi et al. | |
| 6,611,316 B2 | 8/2003 | Sewell | |
| 6,778,257 B2 | 8/2004 | Bleeker et al. | |
| 2001/0026355 A1* | 10/2001 | Aoki et al. ............. | 355/30 |
| 2003/0025890 A1 | 2/2003 | Nishinaga | |
| 2004/0137339 A1* | 7/2004 | Zhang et al. ........... | 430/5 |
| 2005/0151955 A1* | 7/2005 | Laganza et al. ......... | 355/75 |
| 2006/0109448 A1* | 5/2006 | Bruls et al. ............ | 430/5 |

FOREIGN PATENT DOCUMENTS

| | | |
|---|---|---|
| JP | A-61-245163 | 10/1986 |
| JP | A-1-292343 | 11/1989 |
| JP | A-3-132663 | 6/1991 |
| JP | A-6-36054 | 2/1994 |
| JP | A-6-124873 | 5/1994 |
| JP | U-6-36054 | 5/1994 |

(Continued)

OTHER PUBLICATIONS

International Search Report issued in International Patent Application No. PCT/JP2008/053628; mailed May 13, 2008.

(Continued)

*Primary Examiner* — Stephen Rosasco
*Assistant Examiner* — Rashid Alam
(74) *Attorney, Agent, or Firm* — Oliff & Berridge, PLC

(57) ABSTRACT

A pellicle is provided to one end surface of end surfaces of a frame. Another end surface of the end surfaces of the frame has an area that opposes a substrate. A configuration is adopted that prevents the deformation of the one end surface of the frame and the shape of the opposing area on the other end surface from affecting one another.

31 Claims, 13 Drawing Sheets

FOREIGN PATENT DOCUMENTS

| | | |
|---|---|---|
| JP | A-6-283403 | 10/1994 |
| JP | A-7-176468 | 7/1995 |
| JP | A-9-219354 | 8/1997 |
| JP | A-10-163099 | 6/1998 |
| JP | A-10-214783 | 8/1998 |
| JP | A-10-303114 | 11/1998 |
| JP | A-11-98 | 1/1999 |
| JP | A-11-135400 | 5/1999 |
| JP | A-11-194479 | 7/1999 |
| JP | U-11-98 | 7/1999 |
| JP | A-2000-12453 | 1/2000 |
| JP | A-2000-29202 | 1/2000 |
| JP | A-2000-505958 | 5/2000 |
| JP | A-2000-164504 | 6/2000 |
| JP | A-2001-313250 | 11/2001 |
| JP | A-2003-162044 | 6/2003 |
| JP | A-2004-168481 | 6/2004 |
| JP | A-2004-519850 | 7/2004 |
| JP | A-2004-258113 | 9/2004 |
| JP | A-2006-184817 | 7/2006 |
| WO | WO 99/34255 | 7/1999 |
| WO | WO 99/34255 A1 | 7/1999 |
| WO | WO 99/49504 | 9/1999 |
| WO | WO 99/50712 | 10/1999 |
| WO | WO 99/50712 A1 | 10/1999 |
| WO | WO 99/66370 | 12/1999 |
| WO | WO 99/66370 A1 | 12/1999 |
| WO | WO 01/35168 A1 | 5/2001 |
| WO | WO 2004/019128 A2 | 3/2004 |

OTHER PUBLICATIONS

Written Opinion issued in International Patent Application No. PCT/JP2008/053628; mailed May 13, 2008; with English-language translation.

* cited by examiner

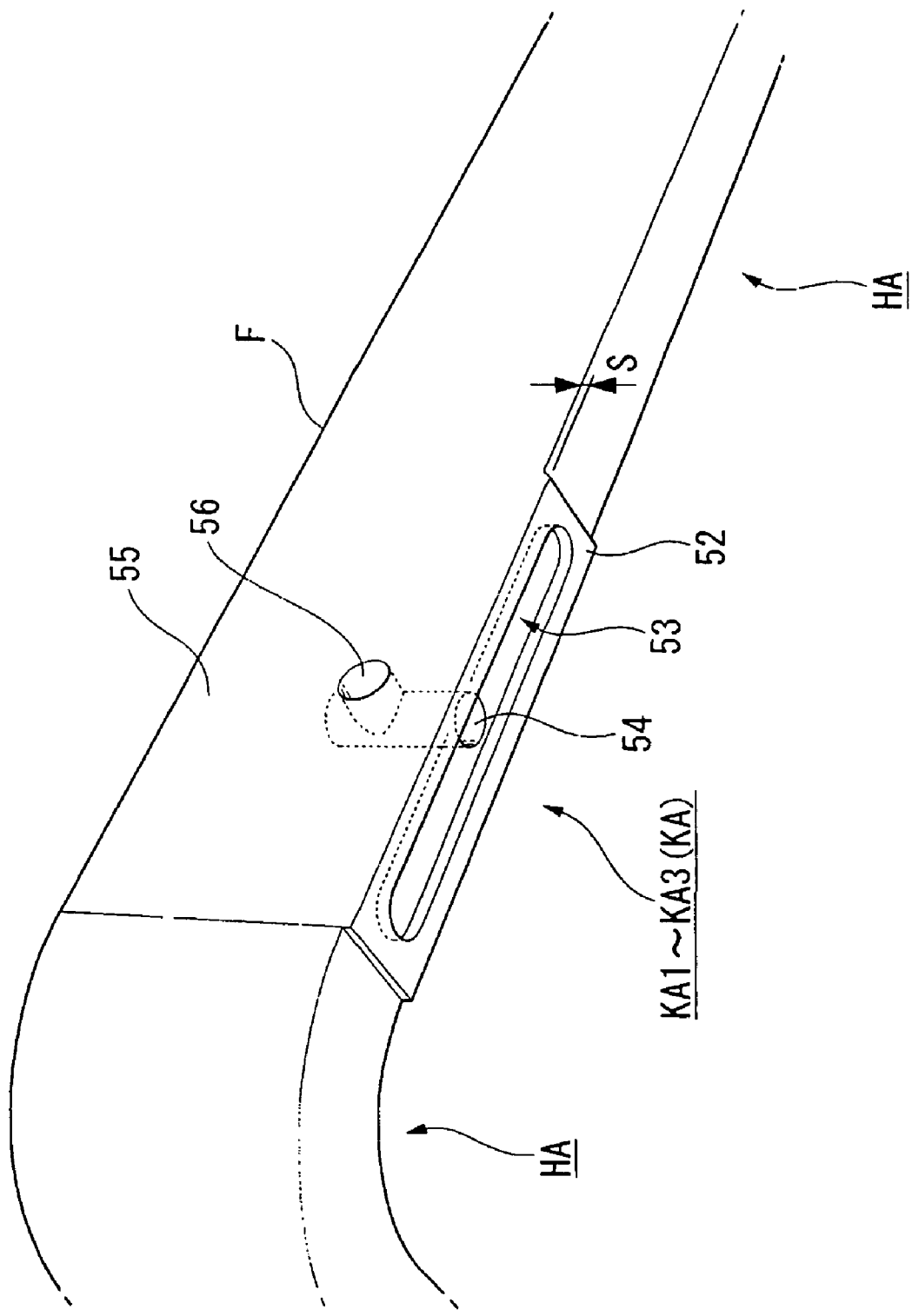

PELLICLE FRAME APPARATUS, MASK, EXPOSING METHOD, EXPOSURE APPARATUS, AND DEVICE FABRICATING METHOD

CROSS-REFERENCE TO RELATED APPLICATION

This application is a non-provisional application claiming benefit of provisional application No. 60/905,592, filed Mar. 8, 2007, and claims priority to Japanese Patent Application No. 2007-051300, filed Mar. 1, 2007, the contents of which are incorporated herein by reference.

BACKGROUND

1. Field of the Invention

The present invention relates to: a pellicle frame apparatus that is used in, for example, a semiconductor exposure apparatus; a mask; an exposing method; an exposure apparatus; and a device fabricating method.

2. Description of Related Art

Photolithography, which is one of the processes used to fabricate a device such as a semiconductor device, a liquid crystal display device, an image capturing device (for example, a charge coupled device, i.e., a CCD), or a thin film magnetic head, uses an exposure apparatus to expose a wafer (or a glass plate and the like), which serves as a substrate and is coated with a photoresist, repeatedly by transferring the pattern of a reticle, which serves as a mask, onto the wafer through a projection optical system. If foreign matter such as dust or waste adheres to the glass surface of the reticle or to the surface of a pellicle that is attached to the reticle, then there is a risk that the outline of the foreign matter will be transferred onto the substrate along with the pattern that is formed in the reticle, which would result in a defect.

Consequently, a protective apparatus, which is called a pellicle, is generally attached to the reticle in order to prevent the foreign matter from adhering to the pattern surface. With such a protective apparatus, a translucent thin film, the main component of which is nitrocellulose or the like, is mounted to a reticle substrate via a frame member (a frame).

Conventionally, the surface of the frame that opposes the substrate is coated with an adhesive, after which it is brought into contact with the substrate and fixed thereto by bonding. Here, if a large load is applied to the frame when it is bonded to the substrate, then the reticle will warp; consequently, Japanese Utility Model Application, Publication Nos. H06-36054A and H11-00098A disclose a technology wherein it is possible to bond a frame to a substrate without any gap and without applying a large load.

Nevertheless, the related art discussed above has the following types of problems. The flatness of the bonding surface (the contact surface) of the frame that bonds with the substrate is not quite satisfactory; consequently, even if the frame and the substrate are bonded without the application of a large load, there is still a risk that the substrate will conform to the frame, thereby causing the substrate (the reticle) to warp.

A purpose of some aspects of the present invention is to provide: a pellicle frame apparatus that can be mounted to a substrate without causing the substrate to conform to the frame; a mask; and an exposing method.

SUMMARY

A first aspect of the invention provides a pellicle frame apparatus wherein a pellicle is provided to one end surface of end surfaces of a frame, and another end surface of the end surfaces of the frame has an opposing area that opposes a substrate, the pellicle frame apparatus comprising a configuration that is capable of preventing the deformation of the one end surface of the frame and the shape of the opposing area on the other end surface from affecting one another.

For example, it is also possible to configure the opposing area so that it comprises a first area, which is provided with a prescribed value of flexural rigidity with respect to the substrate, and second area that are provided with a flexural rigidity with respect to the substrate, the value of which is smaller than that of the first area with respect to the substrate. In this case, when the frame is mounted to the substrate, it can be fixed thereto at the first area; in addition, even if the flatness of the frame is low, it is possible to avoid the situation wherein the second area, the flexural rigidity of which is a small value, constrain the substrate. In other words, it is possible to prevent the deformation of the side of the frame where the pellicle is provided and the shape of the side where the substrate is mounted from affecting one another. Consequently, it is possible to mount the frame and the pellicle to the substrate without constraining such and thereby causing it to warp.

A second aspect of the present invention provides a mask wherein a pattern is formed in a substrate, wherein a pellicle frame apparatus as previously recited is provided to the substrate.

Accordingly, with the mask, it is possible to protect a pattern surface with the pellicle, which is provided to the frame, and to prevent the pattern surface from warping as a result of its being made to conform to the mounted frame, and thereby to transfer the pattern with high precision.

A third aspect of the present invention provides an exposing method comprising: a process that holds a mask as previously recited to a mask stage; and a process that exposes a photosensitive substrate with the pattern of the mask.

Accordingly, the exposing method prevents the mask from warping as a result of its being made to conform to the frame, which makes it possible to expose the photosensitive substrate by transferring the pattern of the mask thereon with high precision.

With the some aspects of the present invention, the frame can be mounted to the substrate without causing the substrate to warp as a result of its being made to conform to the frame, which makes it possible to transfer the pattern of the substrate for exposure with high precision.

BRIEF DESCRIPTION OF THE DRAWINGS

FIG. 2 is an enlarged perspective view of a fixed area.

DESCRIPTION OF EMBODIMENTS

Figure 1:
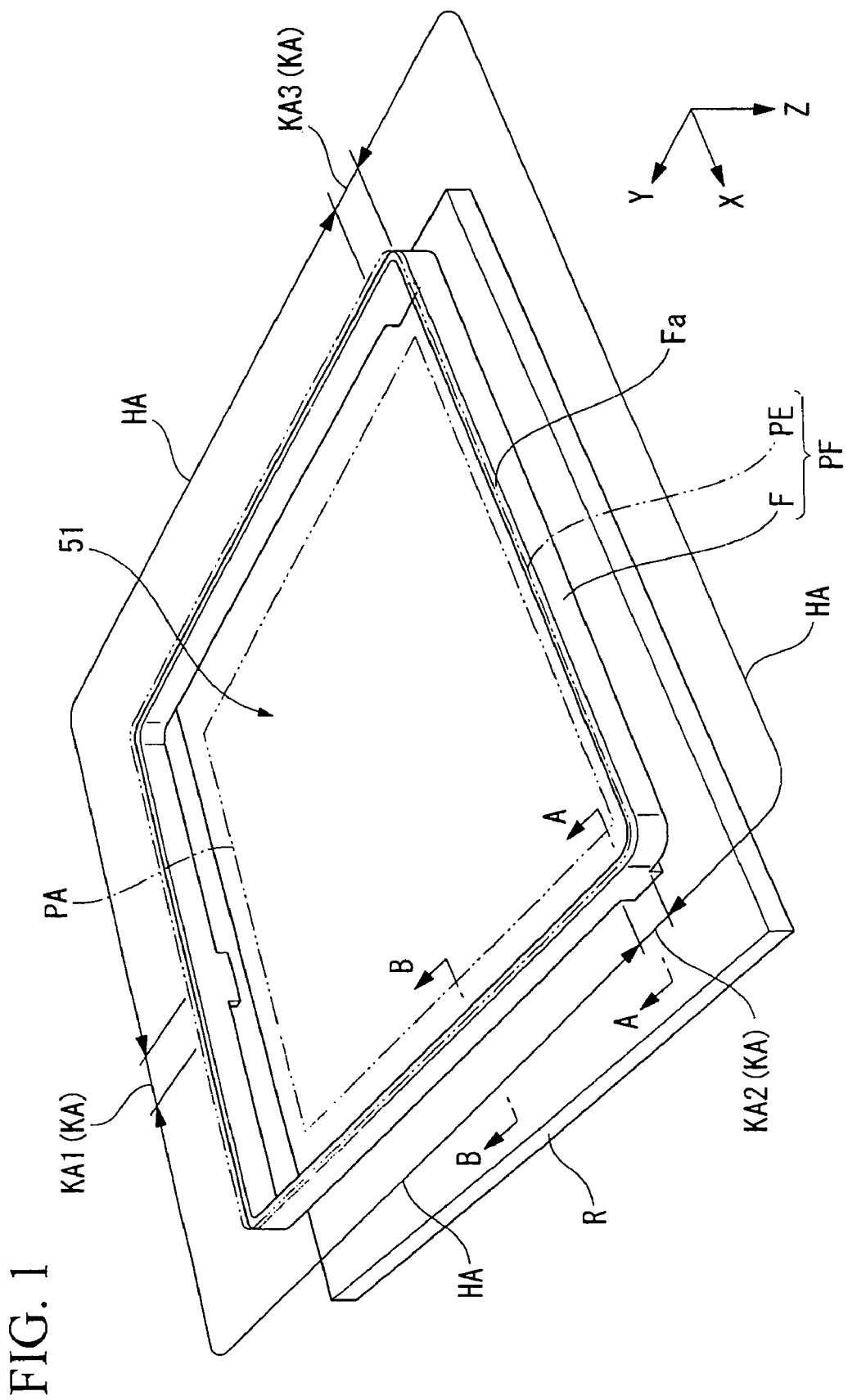
FIG. 1 is a perspective view of a pellicle frame apparatus, viewed from a pattern area side.

The following explains the embodiments of a pellicle frame apparatus, a mask, and an exposing method of the present invention, referencing FIG. 1 through FIG. 15.

Furthermore, to improve the recognition of members in the drawings that are used in the explanation below, the scale of the members are appropriately modified.

<Pellicle Frame Apparatus>

The pellicle frame apparatus will be explained first.

FIG. 1 is a perspective view of a pellicle frame apparatus PF, which protects a pattern area PA of a reticle (mask, substrate) R, viewed from the pattern area PA side.

As shown in the present drawing, the pellicle frame apparatus PF, which protects the pattern area PA, is mounted to the reticle R. The pellicle frame apparatus PF comprises: a frame F, which is provided so that it surrounds the pattern area PA; and a transparent pellicle PE, which is stretched over an end surface Fa on one side of the frame F so that it covers the pattern area PA. The frame F and the pellicle PE form a pellicle internal space 51, which serves as a closed space that covers the pattern area PA of the reticle R.

It is possible to use, for example, a transparent thin film member that has a thickness of approximately several hundred nanometers to several microns and wherein the main component is an organic substance such as nitrocellulose, or plate shaped quartz glass (e.g., fluorine doped quartz) that has a thickness of approximately several hundred microns as the pellicle PE. Furthermore, in addition to nitrocellulose and quartz glass, a member that comprises fluorite or some other inorganic material, such as magnesium fluoride or lithium fluoride, may be used as the pellicle PE. In addition, a frame that is made of a metal (e.g., aluminum or duralumin) or quartz glass and formed into a rectangular frame shape can be used as the frame F. In addition, a ceramic material can be used as the frame. For example, an aluminum alloy frame (with external dimensions of 150×120 mm, a height of 5 mm, and a width, i.e., thickness of 3 mm) that undergoes a blackening process (such as an aluminum anodizing process) can be used as the frame F; furthermore, depending on the case, a filter member (discussed below) may be adhered thereto. In addition, the parallelism of the end surface (Fa) on one side and end surfaces (opposing surfaces 57) on the other side of the frame (F) can be set to less than approximately 5 μm. If, for example, excimer laser light is used as the exposure light, then a pellicle film that transmits such should be selected as the pellicle film. Furthermore, the frame may be made of a resin (plastic) or the like as long as the resin does not emit gas or adversely affect the surrounding environment; furthermore, combinations, such as metal and resin, may be used.

For example, in the configuration shown in FIG. 1, the flexural rigidity of each first area of a plurality of first areas (fixed areas KA) is set to a value that is derived based on the aluminum alloy (Young's modulus of 70 GPa) and a prescribed second moment of area of the corresponding portion of the frame F (flexural rigidity=Young's modulus×second moment of area); furthermore, the flexural rigidity of each second area of a plurality of second areas (non-fixed areas HA) is also set to a value that is determined based on the aluminum alloy (Young's modulus of 70 GPa) and a prescribed second moment of area of the corresponding portion of the frame F. Here, each second area is not directly bonded to the reticle R because a gap S is formed between it and the reticle R; furthermore, each second area is formed so that its second moment of area is smaller than that of each first area; therefore, the flexural rigidity of each second area is smaller than that of each first area. However, the present invention is not limited to such a configuration.

In addition, a frame with uniformly soft flexural rigidity may be used as the frame F as long as it is possible to prevent the deformation of one side of the frame F (the side where the pellicle PE is provided) and the shape of the opposing area on the other side (the side that is bonded to the reticle R) from affecting each other. For example, a resin or the like that meets this condition may be used.

The frame F comprises: the fixed areas (first areas) KA, which are areas that oppose the reticle R, make contact therewith, and that are fixed thereto by bonding; and the non-fixed areas (second areas) HA, which are provided such that gaps are interposed between them and the reticle R. The fixed areas KA comprise a fixed area KA1, which is disposed at the center of one side of the rectangularly shaped frame F that extends in the X directions, and fixed areas KA2, KA3, which are disposed on two sides (one on each side) of the frame F that extend in the Y directions in the vicinity of the −Y side end part (on the side opposite the fixed area KA1); furthermore, the fixed areas KA1-KA3 are disposed on different sides at positions that form the vertices of a substantially isosceles triangle. In more detail, as discussed below, if the scanning directions (the synchronous movement directions), along which the mask and the wafer synchronously move during a scanning exposure, are set to the Y axial directions and the non-scanning directions are set to the X axial directions, then the fixed area KA1 is disposed along a center axis, which runs parallel to the scanning directions through the center of the frame F in the X directions, and the fixed areas KA2, KA3 are disposed so that they have line symmetry with respect to this center axis. Furthermore, the areas of the opposing area of the frame F that exclude these fixed areas KA1-KA3 are the non-fixed areas HA.

Figure 3A:
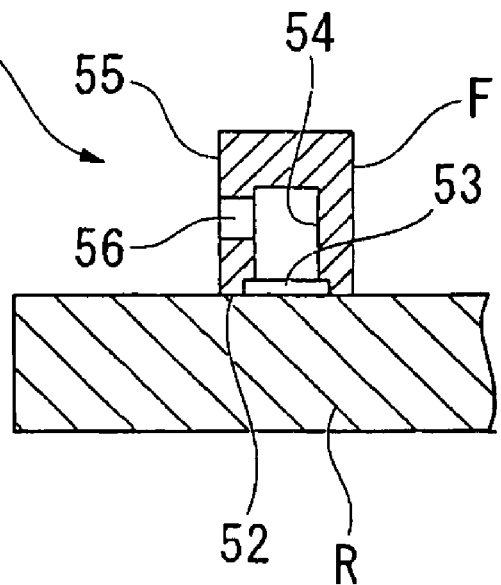
FIG. 3A is a partial cross sectional view of the fixed area.

In each of the fixed areas KA1-KA3, an elliptically shaped groove 53, which forms an adhesive reservoir, is formed in an opposing surface 52 that opposes the reticle R, as shown in FIG. 2. In this case, the length of each opposing surface 52 (i.e., the length of each fixed area KA1-KA3) is set to approximately 10 mm. FIG. 3A is a cross sectional view of each of the fixed areas KA1-KA3 taken along the A-A in FIG. 1. As shown in the present figure, an introducing port 54, which is open to the groove 53 and extends in the Z axial directions, and an injecting port 56, which is open to the side surface 55 that is positioned on the side opposite the pellicle internal space 51 and is connected to the introducing port 54, are formed in the frame F. Adhesive that is poured in from the injecting port 56 reaches the groove 53 via the introducing port 54 and bonds the frame F with the reticle R. Furthermore, the shape of the adhesive reservoir is not limited to the one shown in FIG. 2; for example, it may be configured by carving a thin, shallow, V-shaped groove in the portion that comprises the surface that bonds with the reticle R so that the adhesive is forced out of the groove somewhat.

Figure 3B:
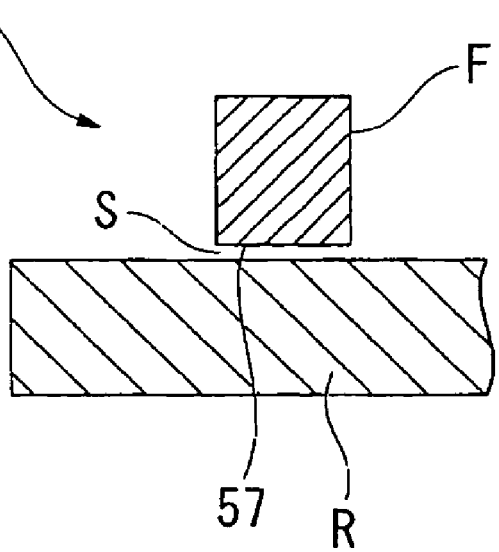
FIG. 3B is a partial cross sectional view of a non-fixed area.

FIG. 3B is a cross sectional view of the non-fixed area HA that is taken along the B-B line in FIG. 1. Furthermore, in the figures starting with FIG. 3A, the pellicle PE is not shown for the sake of convenience.

The non-fixed areas HA comprise the opposing surfaces 57, which are formed by removing a portion with thickness of, for example, less than 100 μm from the opposing surfaces 52 of the fixed areas KA1-KA3, as shown in the present figure. Namely, the non-fixed areas HA are configured so that small gaps S, which are of a size such that external dust does not penetrate, are formed between the non-fixed areas HA and the reticle R when the fixed areas KA1-KA3 contact the reticle R at the opposing surfaces 52; thereby, the non-fixed areas HA do not contact the reticle R. Furthermore, machining, electrical discharge machining, a blasting process, or the like is used when forming each of the opposing surfaces 57.

When the pellicle frame apparatus PF configured as above is mounted to the reticle R, the opposing surfaces 52 of the fixed areas KA1-KA3 are first brought into contact with the reticle R and, in that state, are positioned so that the frame F surrounds the pattern area PA of the reticle R, after which the adhesive is injected into the grooves 53 through the introducing ports 54 via the injecting ports 56. Any adhesive can be used, but it is preferable to use, for example, an ultraviolet light setting adhesive or a thermosetting type adhesive; furthermore, considering the convenience of the process and the need to prevent the pellicle PE from being damaged, it is preferable to use ultraviolet light setting adhesive. Furthermore, the abovementioned adhesive is subsequently used to bond the pellicle PE to the end surfaces Fa of the frame F so that it is stretched across the frame F.

Thus, when the pellicle frame apparatus PF is mounted, the frame F is rigidly fixed to the reticle R at each of the fixed areas KA1-KA3; however, the nonfixed areas HA, which comprise the majority of the area of the frame F that opposes the reticle R, are provided to the frame F in a state wherein the gaps S is interposed therebetween; consequently, the flexural rigidity of the non-fixed areas HA with respect to the reticle R is smaller (substantially zero) than that of the fixed areas KA1-KA3, thereby preventing the reticle R from being constrained and made to conform to the frame F.

Consequently, with the present embodiment, even if the flatness of the surfaces of the frame F that oppose the reticle R is low, it is possible to prevent the reticle R from conforming to those opposing surfaces and warping.

In addition, the three fixed areas KA1-KA3 configured in the present embodiment make it possible to fix the frame F and the pellicle PE to the reticle R without overly constraining the reticle R.

That is, the three fixed areas KA1-KA3 substantially form a three-point support structure for the reticle R. The three-point support structure provides a substantially ideal plane comprising three points, aside from the reference plane that corresponds to a primary flatness for the fixed areas KA1-KA3. By conforming the reticle R to the ideal plane, the occurrence of the undesired stress in the reticle R, such as torsional strain, associated with the bonding of the reticle R and the pellicle frame apparatus PF, can be avoided. In this manner, as the flatness of the frame F is substantially compensated in conformity to the reticle R, the deformation of the reticle R can be restrained.

Furthermore, with the present embodiment, the fixed areas KA1-KA3 are provided to three mutually different sides of the rectangularly shaped frame F, and therefore the reticle R is not dependent on the flexural rigidity or the flatness of any one side of the frame F and is not made to conform thereto, which makes it possible to more reliably prevent the reticle R from warping.

In addition, the small gaps S between the frame F and the non-fixed areas HA in the present embodiment make it possible to prevent dust from penetrating the pellicle internal space 51 inside the frame F through the gaps S and also, because air can flow through the gaps S, to prevent a gas pressure differential from arising between the pellicle internal space 51 and the external space as a result of, for example, thermal expansion of the air; in turn, it is possible to prevent fluctuations in the exposure characteristics of the exposure light. In addition, with the present embodiment, the adhesive injecting ports 56 are provided in the side surfaces 55 that face the outer sides of the frame F, which makes it possible to fix the frame F to the reticle R by supplying the adhesive after the frame F and the reticle R are positioned, and thus to more accurately and more stably mount the pellicle PE without the risk of the conventional situation wherein, after the adhesive is coated, it hardens during the positioning of the frame F and the reticle R.

<Second Embodiment>

Continuing, a second embodiment of the pellicle frame apparatus PF will now be explained, referencing FIGS. 4A and 4B. In contrast to the abovementioned first embodiment, in the second embodiment, a filter member is provided in order to prevent dust from penetrating through the gap S.

Elements in the present figure that are identical to constituent elements in the first embodiment shown in FIG. 1 through FIG. 3B are assigned identical symbols, and the explanations thereof are omitted.

Figure 4A:
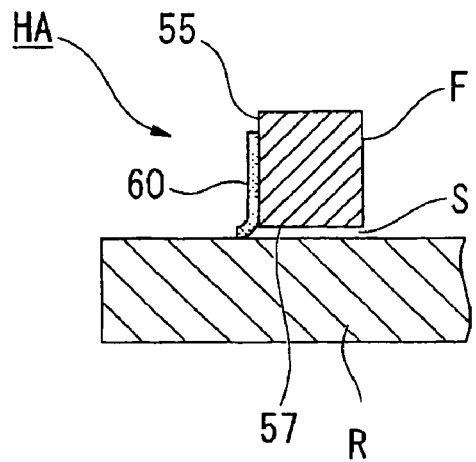
FIG. 4A shows partial cross sectional views of a frame according to a second embodiment.

As shown in FIG. 4A, with the pellicle frame apparatus PF of the present embodiment, a sheet shaped filter member (cover member) 60 that covers the gap S is provided by adhering it to the side surface 55 at least at the non-fixed area HA.

The filter member 60 is porous and has micropores that can capture foreign matter such as dust; for example, a raw material can be used that is a composite of a polyurethane polymer and a film that is fabricated by stretching polytetrafluoroethylene.

The present embodiment obtains advantageous effects that are the same as those of the abovementioned first embodiment; furthermore, providing the filter member 60 makes it possible to prevent foreign matter, such as dust, from penetrating the pellicle internal space 51 through the gaps S, which in turn prevents pattern forming failures (exposure failures) caused by foreign matter adhering to the pattern surface (pattern area PA), while preventing the non-fixed areas HA from constraining the reticle R and causing it to conform to the frame F.

Figure 4B:
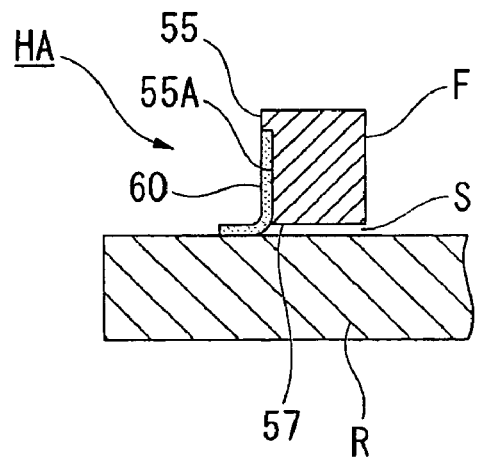
FIG. 4B shows partial cross sectional views of a frame according to a second embodiment.

Furthermore, the position at which the filter member 60 is adhered is not limited to the side surface 55 of the frame F shown in FIG. 4A; for example, as shown in FIG. 4B, it is also possible to provide a groove (recess) 55A by removing part of the side surface 55 along the gap S.

This configuration makes it possible to prevent the filter member 60 from projecting from the side surface 55 of the frame F; thereby, it is possible to attach the filter member 60 without interfering with peripheral equipment—even if adhering the filter member 60 to the present frame F.

<Third Embodiment>

Figure 5:
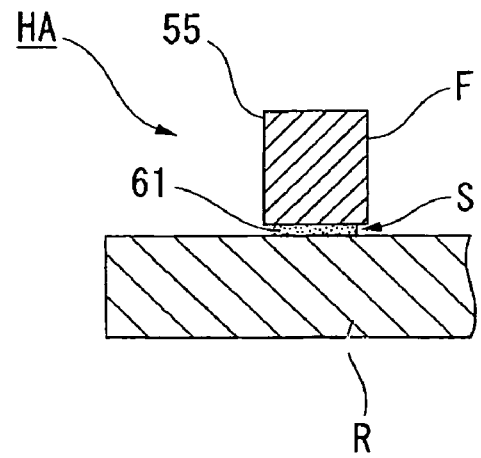
FIG. 5 is a partial cross sectional view of the frame according to a third embodiment.

Continuing, a third embodiment of the pellicle frame apparatus PF will now be explained, referencing FIG. 5. The third embodiment differs from the second embodiment in that the configuration of the filter member that prevents the penetration of dust through the gap S is different.

Furthermore, constituent elements in the present figure that are identical to those in the second embodiment shown in FIGS. 4A and 4B are assigned identical symbols, and the explanations thereof are omitted.

In the present embodiment, the gap S is filled with a filter member 61.

A porous member that is capable of venting gas into and out of the frame F, e.g., a sponge member or foam rubber, is used as the filter member 61.

The present embodiment also obtains advantageous effects that are similar to those of the abovementioned first embodiment, and can prevent the reticle R from conforming to the frame F and warping, even if the flatness of the opposing surface of the frame F, i.e., the surface that opposes the reticle R, is low.

<Fourth Embodiment>

Continuing, a fourth embodiment of the pellicle frame apparatus PF will now be explained, referencing FIG. 6 through FIG. 8. Furthermore, constituent elements in the present figures that are identical to those in the first embodiment shown in FIGS. 1-3B are assigned identical symbols, and the explanations thereof are omitted.

Figure 6:
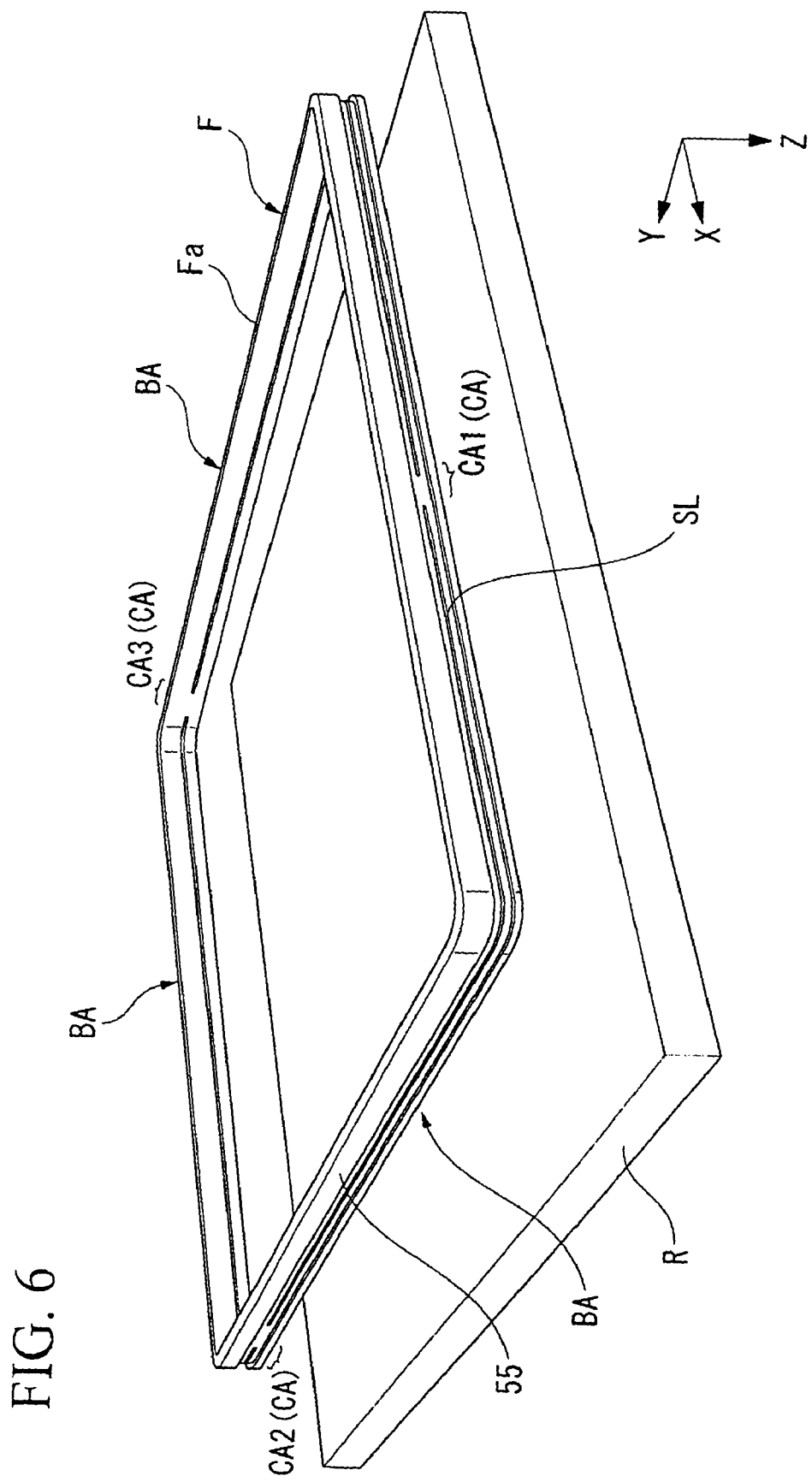
FIG. 6 is an external perspective view of the pellicle frame apparatus according to a fourth embodiment.

In the pellicle frame apparatus PF of the present embodiment as shown in FIG. 6, the entire surface of the opposing area (the opposing surface) of the frame F that opposes the reticle R contacts the reticle R and is fixed thereto by bonding. Furthermore, the frame F comprises: single body, fixed areas (first areas) CA, which are fixed to the reticle R, and splittable-fixed areas (second areas) BA; in addition, at each of the single body, fixed areas (first areas) CA, the frame F is a single body in the thickness directions (the Z directions) and cannot be split between the end surface Fa and the contact part that contacts the reticle R; furthermore, at each of the splittable-fixed areas (second areas) BA, the frame F has a slit SL that is formed between the end surface Fa and the contact part that contacts the reticle R and therefore can be split in the thickness directions.

The single body, fixed areas CA comprise a single body, fixed area CA1, which is disposed at the center of one side of the rectangularly shaped frame F that extends in the X directions, and single body, fixed areas CA2, CA3, which are disposed on two sides of the frame F (one on each side) that extend in the Y directions in the vicinity of the +Y side end part (on the side opposite the single body, fixed area CA1); furthermore, the single body, fixed areas CA1-CA3 are disposed on different sides at positions that form the vertices of a substantially isosceles triangle. In other words, in the present embodiment as well, the single body, fixed area CA1 is disposed along a center axis, which runs parallel to the scanning directions through the center of the frame F in the X directions, and the single body, fixed areas CA2, CA3 are disposed so that they have line symmetry with respect to this center axis.

Figure 7:
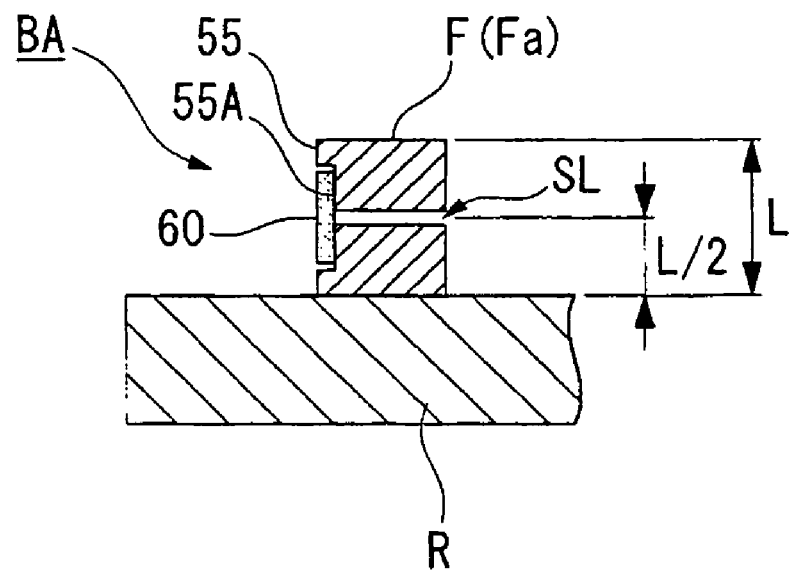
FIG. 7 is a partial cross sectional view of the frame according to the fourth embodiment.
Figure 8:
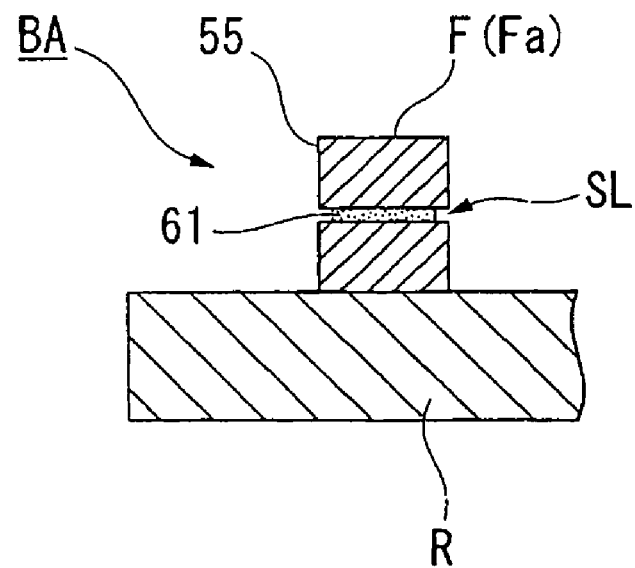
FIG. 8 is a partial cross sectional view of the frame according to another embodiment.

As shown in FIG. 6 and FIG. 7, the slit SL that is provided to each of the splittable-fixed areas BA is formed parallel to the front surface of the reticle R and so that the pellicle internal space 51 and the external space are in communication. In the present embodiment, the position of each of the slits SL is set to L/2, where L is the overall thickness of the frame F. In addition, a groove 55A is formed in the side surface 55 of each of the splittable-fixed areas BA by removing part of the side surface 55 along the slit SL. Furthermore, the filter member 60, which was discussed above, is provided to the groove 55A by adhering it thereto.

With the pellicle frame apparatus PF configured as described above, the frame F is rigidly provided and fixed to the reticle R at each of the single body, fixed areas CA1-CA3; however, the slit SL is provided to each of the splittable-fixed areas BA, which comprise the majority of the area of the frame F that opposes the reticle R, and consequently the flexural rigidity (rigidity) of the frame F is smaller than (⅛) that of each of the single body, fixed areas CA1-CA3 because flexural rigidity is proportional to the cube of the thickness. For example, in the configuration shown in FIG. 6, the flexural rigidity of each first area of the plurality of first areas (single body, fixed areas CA) is set to a value that is derived based on the aluminum alloy (Young's modulus of 70 GPa) and a prescribed second moment of area of the corresponding portion of the frame F; furthermore, the flexural rigidity of each second area of the plurality of second areas (splittable-fixed areas BA) is also set to a value that is determined based on the aluminum alloy (Young's modulus of 70 GPa) and a prescribed second moment of area of the corresponding portion of the frame F. Here, the slits SL are formed in the second areas, each of which is formed so that its second moment of area is smaller than that of each first area; therefore, the flexural rigidity of each second area is smaller than that of each first area. However, the present invention is not limited to such a configuration.

Accordingly, with the present embodiment, even if the flatness of the opposing surface of the frame F that opposes the reticle R is low, it is possible to prevent the reticle R, which has low flexural rigidity, from being deformed by and caused to conform to the frame F, which contacts and is fixed to the reticle R at each of the splittable-fixed areas BA, on the reticle R side, thereby constraining and warping the reticle R.

That is, the deformation of the splittable-fixed areas BA, which has the slit SL and the relatively low rigidity, alleviates and/or absorbs the stress due to the bonding of the frame F and the reticle R. At this time, the opposing surface (contact surface) of the fixed areas KA1-KA3 conforms to a substantially ideal plane, which is specified in conformity to the reticle R, aside from the reference plane that corresponds to a primary flatness. In this manner, as the flatness of the frame F is substantially compensated in conformity to the reticle R, the deformation of the reticle R can be restrained.

In addition, in the present embodiment as well, each of the slits SL is covered by the corresponding permeable filter member 60, thereby making it possible to prevent dust from penetrating the pellicle internal space 51 inside the frame F through the slits SL, which causes pattern forming failures (exposure failures), while preventing a gas pressure differential from arising between the pellicle internal space 51 and the external space. Moreover, with the present embodiment, the relevant filter member 60 is adhered to each of the grooves 55A provided to the frame F, which makes it possible to attach the filter members 60 to the existing frame F without interfering with peripheral equipment.

Furthermore, because the flexural rigidity (the rigidity) of the frame F is proportional to the cube of the thickness, as discussed above, it is preferable to form the slits SL as close to the reticle R as possible, yet still within a range such that the slits SL can be fabricated. In addition, the grooves 55A, to which the filter members 60 are adhered, are not necessarily required; for example, a configuration may be adopted wherein the filter members 60 are adhered to the side surfaces 55, similar to the configuration shown in FIG. 4A. Furthermore, with the present embodiment, instead of using the sheet shaped filter members 60, a configuration may be adopted wherein, similar to the configuration shown in FIG. 5, each of the slits SL is filled with the corresponding filter member 61, which comprises a porous member, as shown in FIG. 8.

In this configuration as well, the reticle R does not warp, the same as described above; in addition, it is possible to prevent dust from penetrating the pellicle internal space 51 inside the frame F through the slits SL, which causes pattern forming failures (exposure failures), while preventing a gas pressure differential from arising between the pellicle internal space 51 and the external space.

In addition, the method of fabricating the frame F may be a procedure wherein the slits SL are formed in the frame F directly by, for example, machining or laser beam machining, or by separately fabricating upper and lower frame component members and subsequently joining them so that they are integrated such that the slits SL are interposed therebetween.

<Exposure Apparatus>

Continuing, the exposure apparatus that performs an exposing process using the reticle R, whereon the abovementioned pellicle frame apparatus PF is mounted, will now be explained, referencing FIG. 9 through FIG. 12.

Figure 9:
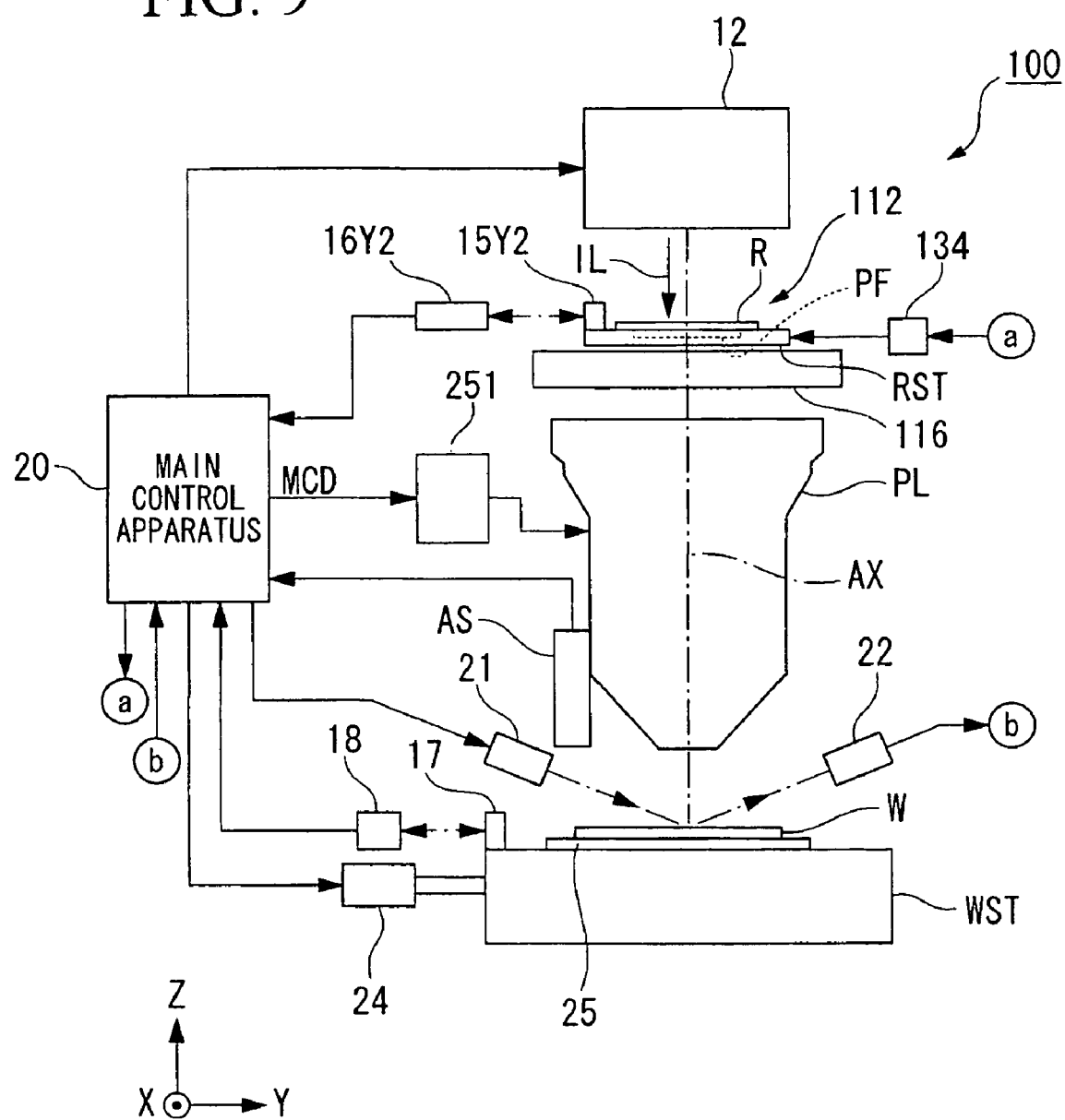
FIG. 9 is a schematic block diagram of an exposure apparatus according to the present invention.

FIG. 9 schematically shows the entire configuration of an exposure apparatus 100 according to one embodiment of the present invention. The exposure apparatus 100 is a step-and-scan-type projection exposure apparatus.

The exposure apparatus 100 comprises: an illumination system 12 that includes a light source and an illumination optical system; a reticle stage apparatus 112 that drives the reticle R, whereon the pellicle frame apparatus PF that was discussed above is mounted, by a prescribed stroke in the Y axial directions, and finely drives such in the X axial, Y axial, and θz directions (the rotational directions around the Z axis); a projection optical system PL; a wafer stage WST whereon a wafer (a photosensitive substrate) W is mounted; an off axis type alignment detection system AS; a computer, e.g., a workstation; a main control apparatus 20 that performs supervisory control of the entire apparatus; and the like.

As disclosed in, for example, Japanese Patent Application, Publication No. 2001-313250A (corresponding U.S. Patent Application, Publication No. 2003/0025890), the illumination system 12 comprises: a luminous flux intensity uniformizing optical system that includes a light source, an optical integrator, and the like; a beam splitter; a relay lens; a variable ND filter; a reticle blind; and the like (none of which are shown). The illumination system 12 illuminates an illumination area, which is defined by the reticle blind and has a slit shape that extends so that it is long and thin in the X axial directions, on the reticle R with an illumination light IL with substantially uniform luminous flux intensity. Here, as one example, ArF excimer laser light (193 nm wavelength) is used as the illumination light IL. In addition, a fly-eye lens, a rod integrator (an internal reflection type integrator), a diffractive optical element, or the like can be used as the optical integrator.

The reticle stage apparatus 112 is disposed below the illumination system 12. The reticle stage apparatus 112 is mounted above (on the +Z side of) a reticle stage base plate 116, which is disposed below the illumination system 12 such that is spaced apart therefrom by a prescribed interval.

The reticle stage base plate 116 is supported substantially horizontally on a floor surface by, for example, four legs (not shown). The reticle stage base plate 116 comprises a substantially plate-shaped member, and, at substantially the center thereof, a rectangular opening, the longitudinal directions of which are set along the X axial directions, is formed so as to penetrate in the Z axial directions so that the illumination light IL can pass therethrough. An upper surface of the reticle stage base plate 116 constitutes a moving surface of a reticle stage RST.

The reticle stage RST is levitationally supported above the upper surface (the moving surface) of the reticle stage base plate 116 with a clearance of, for example, approximately several microns. The reticle R is fixed on the reticle stage RST by vacuum chucking. A reticle stage drive system 134 shown in FIG. 9 can finely drive the reticle stage RST two dimensionally within an XY plane that is perpendicular to an optical axis AX of the projection optical system PL (the X axial directions, the Y axial directions, and the rotational directions, i.e., the θz directions around the Z axis orthogonal to the XY plane), and can also drive the reticle stage RST on the reticle stage base plate 116 at a specified scanning speed in the Y axial directions. Furthermore, the configuration of the reticle stage apparatus 112 will be discussed in detail later.

The projection optical system PL is disposed below the reticle stage RST in FIG. 9 and the directions of its optical axis AX are set to the Z axial directions. The projection optical system PL is, for example, a double telecentric reduction system and comprises a plurality of lens elements (not shown) that share the optical axis AX in the Z axial directions. In addition, a system that has a projection magnification β of, for example, ¼, ⅕, or ⅛ is used as the projection optical system PL. Consequently, if the illumination light (the exposure light) IL illuminates the illumination area on the reticle R as discussed above, then an image (a partial inverted image), which is an image of a pattern formed in the reticle R that has been reduced by the projection optical system PL using the projection magnification β, is projected and transferred to a slit shaped exposure area on the wafer W, the front surface of which is coated with a resist (a photosensitive agent).

Furthermore, with the present embodiment, specific lens elements (for example, five prescribed lens elements) of the abovementioned plurality of lens elements are independently movable. Each of the specific lens elements is moved by three drive devices, such as piezoelectric devices, that are provided thereto. Namely, separately driving these drive devices makes it possible to move a specific lens element independently, e.g., by translationally moving it along the optical axis AX in accordance with the amount of displacement of the drive devices, or inclining it at a desired inclination with respect to a plane that is perpendicular to the optical axis AX. With the present embodiment, an image forming characteristic correction controller 251 outputs a drive instruction signal, which is for driving the abovementioned drive devices, based on an instruction MCD from the main control apparatus 20, thereby controlling the amount of displacement of each of the drive devices.

With the projection optical system PL thus configured, it is possible to compensate for various aberrations (types of optical characteristics), such as distortion, field curvature, astigmatism, coma aberration, and spherical aberration, using the main control apparatus 20 to control the movement of the lens elements via the image forming characteristic correction controller 251.

The wafer stage WST is disposed below the projection optical system PL in FIG. 9 and above a base (not shown), and a wafer holder 25 is mounted on its upper surface. The wafer W is fixed on the wafer holder 25 by, for example, vacuum chucking.

A wafer stage drive part 24, which includes a motor and the like, synchronously moves the wafer stage WST in the scanning directions (the Y axial directions) and the non-scanning directions (the X axial directions), which are perpendicular to the scanning directions. Furthermore, a step-and-scan operation is executed that repeatedly performs: an operation wherein a shot region on the wafer W is scanned and exposed by scanning the wafer W relative to the reticle R via the wafer stage WST; and an operation wherein the next shot is moved to the scanning start position (the acceleration start position) in order to undergo exposure.

A wafer laser interferometer (hereinbelow, "wafer interferometer") 18 continuously detects the position of the wafer stage WST within the XY plane with a resolving power of, for example, approximately 0.5-1 nm via a movable mirror 17. The information about the position (or information about the speed) of the wafer stage WST is sent to the main control apparatus 20, which controls the drive of the wafer stage WST via the wafer stage drive part 24 based on this positional information (or speed information).

In addition, the wafer stage drive part 24 finely drives the wafer stage WST in the Z axial directions, the θx directions (the rotational directions around the X axis, i.e., the pitching directions), the θy directions (the rotational directions around the Y axis, i.e., the rolling directions) and the θz directions (the rotational directions around the Z axis, i.e., the yawing directions).

The alignment detection system AS is disposed on a side surface of the projection optical system PL. In the present embodiment, an image forming type alignment sensor that measures, for example, a street line or a position detection mark (a fine alignment mark) that is formed on the wafer W is used as the alignment detection system AS. The detailed configuration of the alignment detection system AS is disclosed in, for example, Japanese Patent Application, Publication No. H9-219354A. The results of the measurements made by the alignment detection system AS are supplied to the main control apparatus 20.

Furthermore, the apparatus shown in FIG. 9 is provided with a multipoint focus position detection system (21, 22), which is one of the oblique incidence type focus detection systems (focal point detection systems) that detects the positions of the interior of the exposure area, which is on the front surface of the wafer W, and the area in the vicinity thereof in the Z axial directions (the optical axis AX directions). The detailed configuration of the multipoint focus position detection system (21, 22) is disclosed in, for example, Japanese Patent Application, Publication No. H6-283403A. The detection results of the multipoint focus position detection system (21, 22) are supplied to the main control apparatus 20.

Furthermore, although not shown, the exposure apparatus 100 of the present invention is provided with two reticle alignment systems, each of which is a TTR (through-the-reticle) alignment optical system that uses light of the same wavelength as the exposure wavelength, that are disposed above the reticle R and simultaneously observe a reticle mark on the reticle R and a mark on the fiducial mark plate through the projection optical system PL. Reticle alignment systems that are configured similarly to those that are disclosed in, for example, Japanese Patent Application, Publication No. H7-176468A can be used as the present reticle alignment systems.

Figure 10:
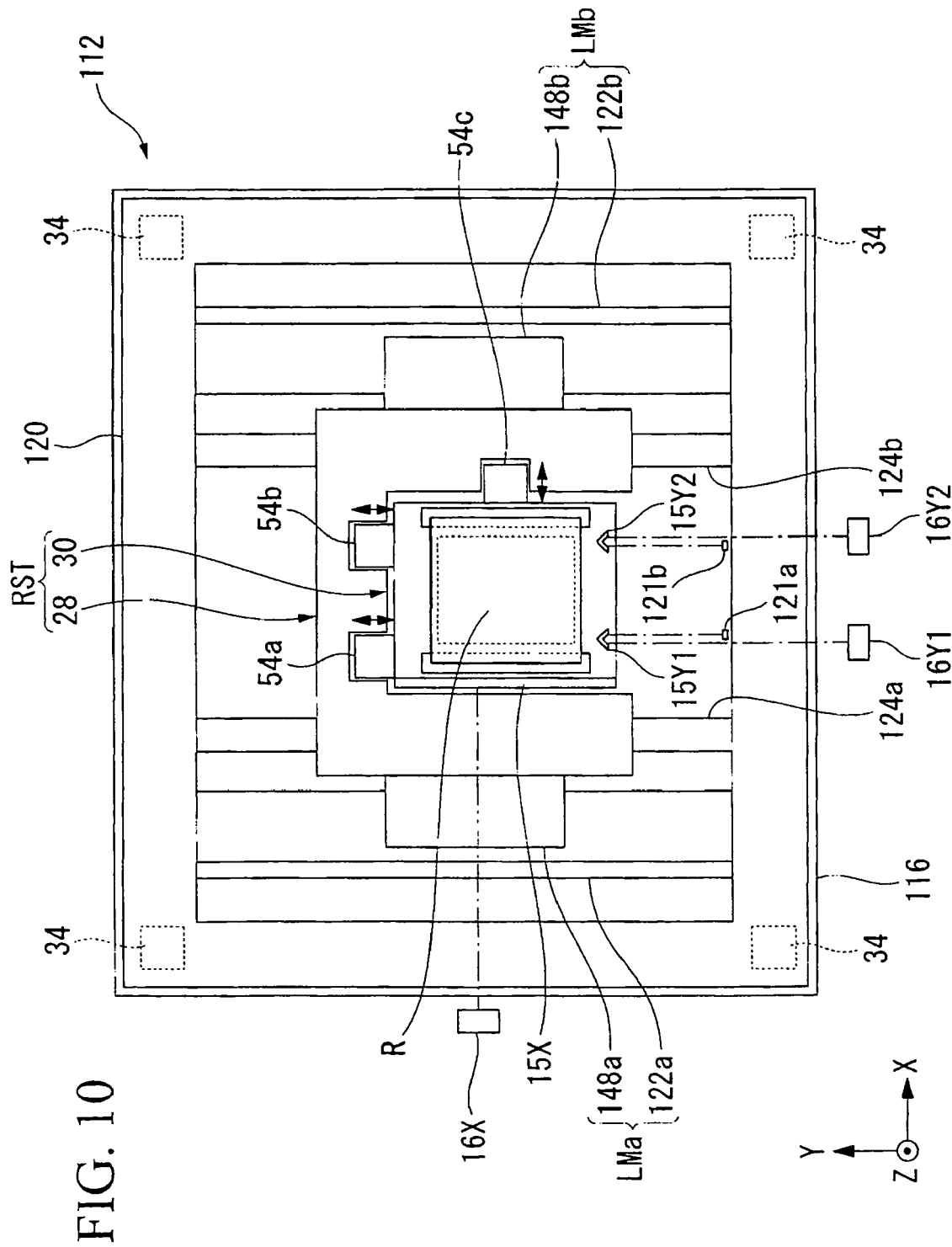
FIG. 10 is a plan view of a reticle stage apparatus that includes a reticle stage.

Next, the details of the reticle stage apparatus (mask stage) 112 will be explained. FIG. 10 is a plan view of the components of the reticle stage apparatus 112.

As shown in FIG. 10, the reticle stage apparatus 112 comprises the reticle stage RST, which is disposed above the reticle stage base plate 116, a counter mass 120 that is disposed above the reticle stage base plate 116 in a state wherein it surrounds the reticle stage RST, and a reticle stage drive system that drives the reticle stage RST.

As is clear from FIG. 10, the counter mass 120 is rectangularly frame shaped in a plan view and is supported noncontactually with respect to the upper surface of the reticle stage base plate 116 by differential exhaust type aerostatic bearings 34, which are provided in the vicinity of the four corners of its lower surface. Consequently, the counter mass 120 moves freely by the application of force in a horizontal direction.

Furthermore, a trim motor that adjusts the attitude of the counter mass 120 can be provided thereto.

Y axis stators 122a, 122b that extend in the Y axial directions are disposed in an interior space (within the frame) of the counter mass 120 in the vicinity of the −X side and the +X side end parts, respectively, and Y axis guides 124a, 124b that extend in the Y axial directions are disposed on the inner side of the Y axis stators 122a, 122b.

The +Y side end parts of the Y axis stators 122a, 122b and the Y axis guides 124a, 124b are fixed to an inner wall surface of the side of the counter mass 120 on the +Y side, and the −Y side end parts are fixed to an inner wall surface of the side of the counter mass 120 on the −Y side. Namely, the Y axis stators 122a, 122b and the Y axis guides 124a, 124b are provided so that they span the +Y and −Y sides of the counter mass 120. In this case, the Y axis stators 122a, 122b are disposed so that they are bilaterally symmetric in the plan view shown in FIG. 10, and the Y axis guides 124a, 124b are also disposed bilaterally symmetric in the plan view shown in FIG. 10.

Each of the Y axis stators 122a, 122b comprises an armature unit, which is T shaped in an XZ cross sectional view and has a plurality of armature coils that is disposed with a prescribed pitch along the Y axial directions. The Y axis guides 124a, 124b are rectangular in an XZ cross sectional view and are each provided with a flatness that is greater than the surrounding four surfaces (the upper surface, the lower surface, the right side surface, and the left side surface).

As shown in FIG. 10, the reticle stage RST comprises a reticle coarse motion stage 28 that moves along the Y axis guides 124a, 124b, and a reticle fine motion stage 30 that is finely driven by three actuators (e.g., voice coil motors) 54a, 54b, 54c in the X axial directions, the Y axial directions, and the θz directions (the rotational directions around the Z axis) with respect to the reticle coarse motion stage 28.

To describe this in further detail, the reticle coarse motion stage 28 has an inverted U shape in a plan view (viewed from above), and both end parts (the portions where the longitudinal directions are the Y axial directions) of the U shape extend in the Y axial directions and are rectangularly frame shaped in an XZ cross sectional view (although this is not shown), and the Y axis guides 124a, 124b are inserted therein. A plurality of differential exhaust type aerostatic bearings is provided to the inner surfaces (four surfaces) of each end part of the U shape, and maintains a spacing of approximately several microns in the X axial directions and the Z axial directions between the Y axis guides 124a, 124b and the coarse motion stage 28. In addition, Y axis sliders 148a, 148b, which comprise magnetic pole units, are provided to the −X side end surface and the +X side end surface of the reticle coarse motion stage 28.

As shown in FIG. 10, a pair of Y axis linear motors LMa, LMb that comprise moving magnet type, electromagnetically driven linear motors are configured so that the Y axis sliders 148a, 148b engage with the Y axis stators 122a, 122b discussed earlier, respectively, and the Y axis sliders 148a, 148b and the Y axis stators 122a, 122b drive the reticle stage RST in the Y axial directions. Furthermore, moving coil type linear motors may also be used as the Y axis linear motors LMa, LMb.

Figure 11:
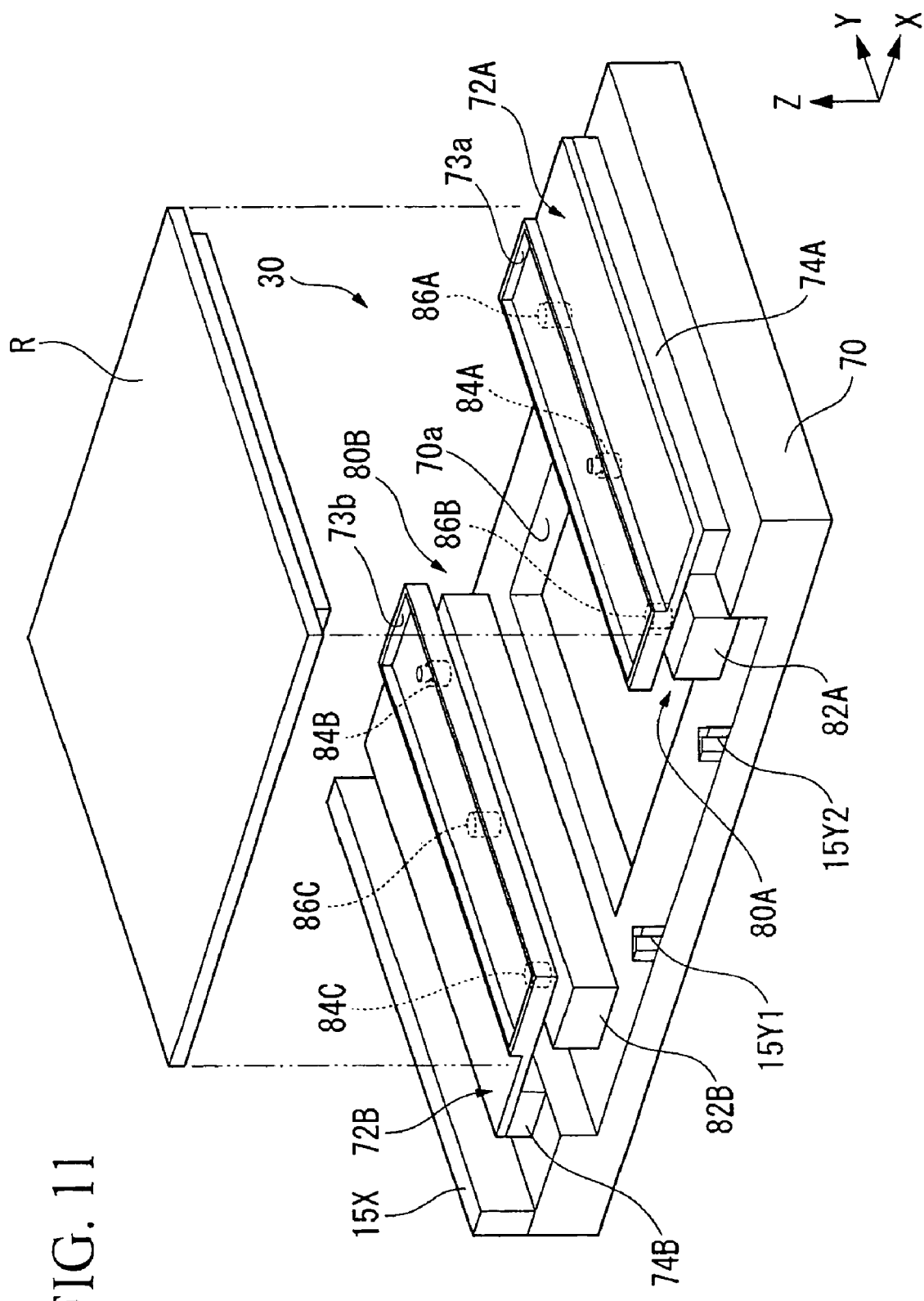
FIG. 11 is a perspective view that shows a reticle fine motion stage in a removed state.

FIG. 11 shows a perspective view wherein the reticle fine motion stage 30 is in a removed state. As is clear from FIG. 11 and FIG. 10, the reticle fine motion stage 30 comprises a stage main body 70, which is made of a substantially flat plate shaped member that is substantially U shaped in an XZ cross sectional view, and reticle holders 72A, 72B that are provided on the stage main body 70 in the vicinity of the +X end part and the −X end part, respectively, the longitudinal directions of which are set to the Y axial directions. As shown in FIG. 11, a rectangular opening 70a is formed in the center part of the stage main body 70.

Figure 12:
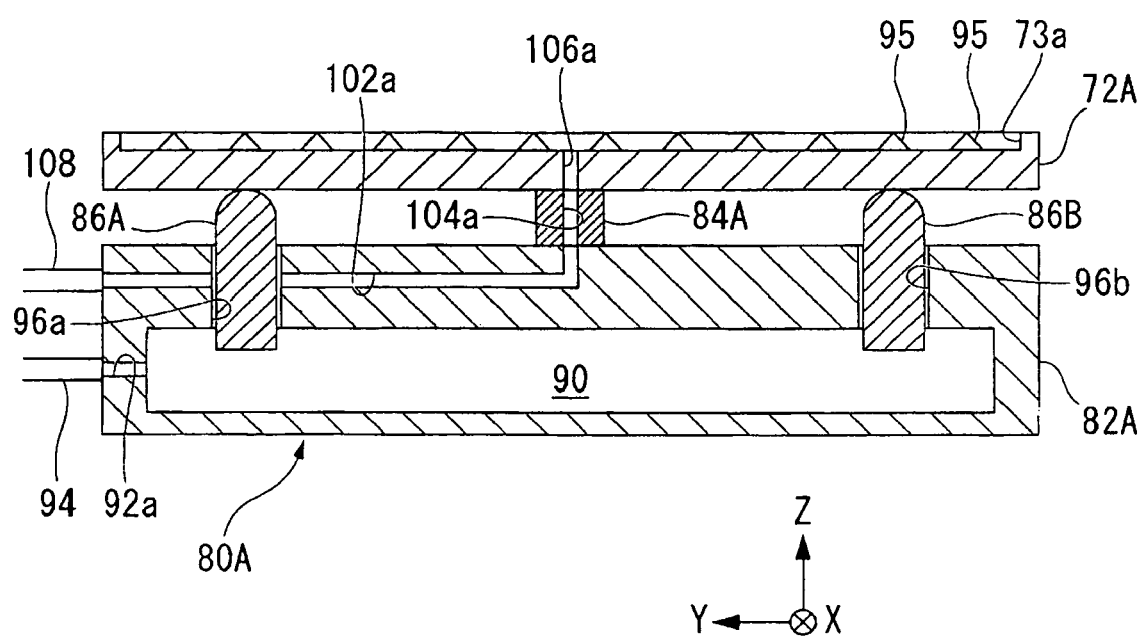
FIG. 12 shows a cross sectional view of a reticle holder and a support mechanism.

The reticle holder 72A is made of a flexible member, such as silica, $CaF_2$, $MgF_2$, $BaF_2$, $Al_2O_3$, or Zerodur, is disposed so that its longitudinal directions are set in the Y axial directions, and has a substantially flat plate shape that is rectangular in a plan view (viewed from above). The thickness (in the Z axial directions) of the −X side half of the reticle holder 72A is large, and a recessed part 73a of a prescribed depth is formed in an area thereof. The recessed part 73a is disposed so that its longitudinal directions are in the Y axial directions and is rectangularly shaped in a plan view (viewed from above); furthermore, as shown in FIG. 12, a plurality of projection parts 95 is provided inside the recessed part 73a.

The reticle holder 72A is cantilevered above the stage main body 70 via a block shaped member 74A, the longitudinal directions of which are set in the Y axial directions. In this case, the reticle holder 72A and the member 74A may be solidly fixed to one another by an adhesive or the like; alternatively, for example, a vacuum chuck mechanism may be provided to the upper surface of the member 74A, and that vacuum chuck mechanism may fix the reticle holder 72A to the member 74A by vacuum chucking.

A support mechanism 80A is provided on the lower side (the −Z side) of the reticle holder 72A. As can be seen from, for example, FIG. 12, which shows a cross section of the support mechanism 80A and the reticle holder 72A, the support mechanism 80A comprises: a support mechanism main body 82A, which has a hollow interior and is a rectangular parallelepiped; a support pin 84A, which is provided to the upper surface of the support mechanism main body 82A at its center part in the Y axial directions; a piston member 86A, which is substantially columnar (its upper end part is fabricated into a spherical surface) and is provided at a position such that it is spaced apart from the from the support pin 84A on the +Y side by a prescribed distance; and a piston member 86B, which is substantially columnar (its upper end part is fabricated into a spherical surface) and is provided at a position such that it is spaced apart on the −Y side by a prescribed distance. The piston member 86A, the support pin 84A, and the piston member 86B are disposed so that they are equispaced in the Y axial directions.

A hollow part inside the support mechanism main body 82A is an air chamber 90. One end of a ventilation conduit 92a, which is formed in the support mechanism main body 82A, is in communication with the air chamber 90, and one end part of a gas supply pipe 94 is externally connected to another end of the ventilation conduit 92a. A gas supply apparatus (not shown) is connected to another end part of the gas supply pipe 94. The gas supply apparatus comprises, for example, a pump and a suction valve. The main control apparatus 20 in FIG. 9 controls the operation of each part, e.g., the pump and the suction valve.

In addition, through holes 96a, 96b, which are circular in an XY cross sectional view, are formed in the support mechanism main body 82A in the vertical directions (the Z axial directions), and the piston members 86A, 86B discussed earlier are slidably inserted through the through holes 96a, 96b.

Furthermore, a substantially L shaped air exhaust conduit 102a is formed in the support mechanism main body 82A so that it does not mechanically interfere with the through hole 96a. One end part of the air exhaust conduit 102a is in communication with the recessed part 73a via a conduit 104a, which is formed so that it passes through the support pin 84A in the Z axial directions, and a conduit 106a, which is formed so that it passes through the reticle holder 72A in the Z axial directions. One end part of the gas exhaust pipe 108 is connected to another end of the air exhaust conduit 102a, and another end part of the gas exhaust pipe 108 is connected to a vacuum pump (not shown). The main control apparatus 20 in FIG. 9 controls the operation of this vacuum pump.

Returning to FIG. 11, the other reticle holder 72B is laterally symmetric to the reticle holder 72A and has substantially the same configuration (the layout relationship of the support pins and the piston members are the reverse of those of the reticle holder 72A), and therefore a detailed explanation thereof is omitted herein.

With the reticle holders 72A, 72B and the support mechanisms 80A, 80B configured as described above, when the reticle R is mounted on the reticle holders 72A, 72B and the pump (not shown) is operated under the instructions of the main control apparatus 20, the pressure in the space formed by the reticle R and the recessed part 73A of the reticle holder 72A and in the space formed between the reticle R and a recessed part 73b of the reticle holder 72B is lowered, thereby vacuum chucking the reticle R. In this case, because the reticle holders 72A, 72B comprise flexible members as discussed earlier, their upper surfaces deform so that they conform to the shape of the lower surface of the reticle R. In other words, the shapes of the upper surfaces of the reticle holders 72A, 72B follow the shape of the lower surface (the held surface) of the reticle R so that they substantially coincide therewith, thereby preventing the reticle R from being deformed (warped and the like) by the vacuum chucking thereof. In addition, the reticle holders 72A, 72B are supported from their lower sides by the support pin 84A and support pins 84B, 84C of the support mechanisms 80A, 80B. Accordingly, the reticle holders 72A, 72B are supported by the support pins 84A-84C at three points, their positions are constrained in the Z axial directions at these support points, and therefore the reticle R is positioned in the Z axial directions at these three points.

According to the exposure apparatus 100 of the present embodiment, which is configured as discussed above, similar to a regular scanning stepper: a reticle R whereon a pellicle frame apparatus PF is mounted is held by the reticle stage 112 (the reticle holders 72A, 72B); prescribed preliminary procedures are performed such as reticle alignment, baseline measurement of the alignment system AS, and EGA (enhanced global alignment) wafer alignment; and a step-and-scan system exposure operation is performed. Furthermore, with the present embodiment, the main control apparatus 20 appropriately controls the movement of the lens elements via the image forming characteristic correction controller 251 so as to compensate for various aberrations (one type of optical characteristic), e.g., distortion.

Thus, with the present embodiment, the mounting of the pellicle frame apparatus PF does not cause the reticle R to warp, and the reticle R is prevented from deforming (warping and the like), even when it is chucked by the reticle holders 72A, 72B, and therefore it is possible to eliminate transfer errors caused by warpage of the reticle R and to transfer the pattern of the reticle R to and form that pattern on the wafer W with high precision. In addition, with the present embodiment, because the fixed areas KA1-KA3, as shown in FIG. 1 for example, are disposed such that they have line symmetry with respect to an axis that is parallel to the scanning directions, even if the reticle R deforms as a result of its being fixed by the fixed areas KA1-KA3, that deformation is symmetric to the directions in which the slit shaped illumination light IL extends, which makes it possible to compensate for that distortion easily by controlling the movement of the lens elements via the image forming characteristic correction controller 251.

The above explained the preferred embodiments according to the present invention, referencing the attached drawings, but of course the present invention is not limited to these embodiments. Each of the constituent members, shapes, and combinations described in the embodiments discussed above are merely exemplary, and it is understood that variations and modifications based on, for example, design requirements may be effected without departing from the spirit and scope of the invention.

Figure 13A:
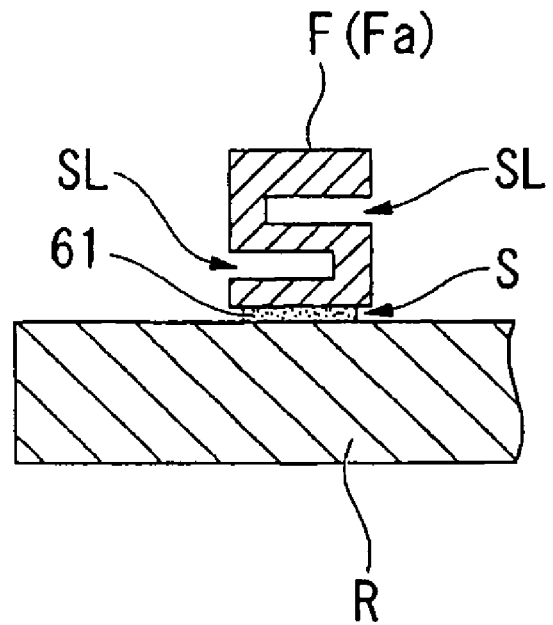
FIG. 13A is a partial cross sectional view that shows the frame according to another embodiment.

The embodiments described above illustrate, for example, a configuration wherein a gap S is provided between the reticle R and each of the second areas of the frame F, and a configuration wherein slits SL are provided in the frame F, but the present invention is not limited thereto; for example, as shown in FIG. 13A, a configuration may be adopted wherein a gap S is provided between the frame F and the reticle R and slits SL are provided to the frame F that do not connect the interior space and the external space. In this case as well, the gap S is preferably filled with the filter member 61. Thereby, it is possible to prevent the penetration of dust and a gas pressure differential from being created between the pellicle internal space 51 and the external space. In addition, because the slits SL are provided to the frame F, it is possible to reduce the flexural rigidity and to prevent the reticle R from warping.

Figure 13B:
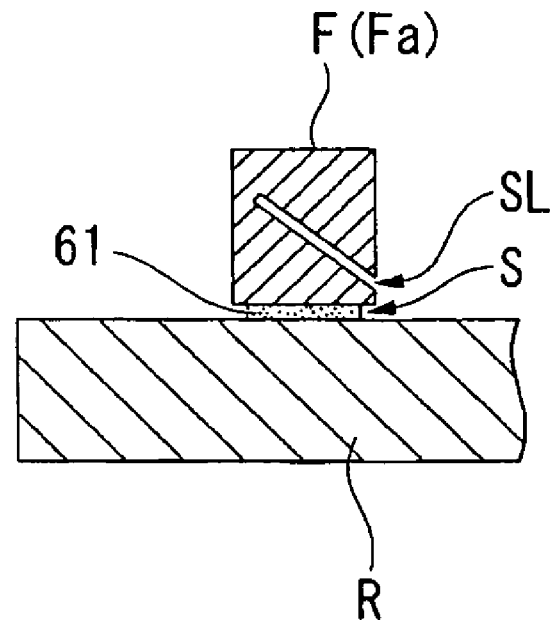
FIG. 13B is a partial cross sectional view that shows the frame according to another embodiment.

Furthermore, in addition to the directions along the front surface of the reticle R, the slits SL may be formed along directions that are inclined with respect to the front surface of the reticle R, as shown in FIG. 13B.

In addition, it is also possible not to provide the filter member 61 in the configurations of FIG. 13A and FIG. 13B. In addition, the slits SL may be formed around the entire perimeter of the frame F, or they may be formed partially therearound, as shown in the configuration of FIG. 6.

Furthermore, in order to prevent the pellicle from deforming as a result of a gas pressure differential arising between the interior and the exterior of the pellicle (the frame), the pellicle may be made such that there is permeability between its interior and exterior so that a gas pressure differential is not created. At this time, the filter member may provide this function, or a separate configuration may be adopted in order to provide permeability.

Thus, with the pellicle frame apparatus PF in each of the embodiments described above, the frame F is provided with first areas, each of which is provided with a prescribed value of flexural rigidity with respect to the reticle R (for example, a portion where the Young's modulus is on the same order as that of the various frames conventionally used, e.g., 70 GPa in the case where the frame is made of aluminum), and second areas, each of which has a flexural rigidity with respect to the reticle R that is smaller than that of the first areas, and therefore the reticle R tends not to warp even when the pellicle frame apparatus PF is mounted thereto. Namely, even if the parallelism of one end surface (Fa) and the other end surface (opposing surface 57) of the frame F or the flatness of every surface is set to a prescribed value, it is conceivable that the frame F itself (particularly the end surface Fa side) will warp as a result of the pellicle film sticking thereto. In contrast, with the configuration of each of the above-mentioned embodiments, it is possible to avoid the situation wherein the warpage of the frame F on the side where the pellicle (PE) is provided is transferred as is to the reticle R, which makes it possible to prevent the reticle R from being constrained by the warpage created in the frame F, even if the pellicle frame apparatus PF is mounted to the reticle R. In addition, the flexural rigidity of the second areas of the frame F with respect to the reticle R may be set to approximately the same as that of the various frames that are conventionally used, and so that it is higher than that of the first areas with respect to the reticle R.

Furthermore, with each of the embodiments described above, configurations are adopted wherein the first areas (KA, CA) and the second areas (HA, BA) are provided in directions along the sides of the frame F (the perimetric directions); however, by providing the first areas and the second areas in the height directions (the Z directions in the figure) of the frame F, it is possible to prevent the deformation of the frame (F) on the side where the pellicle (PE) is provided and the shape of the frame (F) on the side that is mounted to the substrate (R) from affecting each other. With such a configuration as well, it is possible to mount the frame (F) and the pellicle (PE) to the substrate (R) without constraining the substrate and causing it to warp.

In addition, areas are formed along the sides of the frame F (the perimetric directions) that have different flexural rigidities, but, as discussed earlier, the present invention is not limited thereto. For example, even if the flexural rigidities along the sides of the frame F (the perimetric directions) are uniform, it is preferable to prevent the deformation of the frame (F) on the side where the pellicle (PE) is provided and the shape of the frame (F) on the side that is mounted to the substrate (R) from affecting each other.

The substrate of the abovementioned embodiments is not limited to a semiconductor wafer for fabricating semiconductor devices, and can also be adapted to, for example, a glass substrate for a display device, a ceramic wafer for a thin film magnetic head, or an original plate (synthetic quartz, silicon wafer) of a mask or a reticle used by an exposure apparatus.

In addition, a KrF excimer laser (248 nm), an ArF excimer laser (193 nm), an $F_2$ laser (157 nm), as well as a g-line (436 nm) or i-line (365 nm) light source can be used as the light source of the exposure apparatus wherein the present invention is adapted. Furthermore, the magnification of the projection optical system is not limited to a reduction system, but may also be a unity magnification system or an enlargement system. In addition, the abovementioned embodiments described an example of a dioptric projection optical system, but the present invention is not limited thereto. For example, the optical system may be catadioptric type or catoptric.

In addition, the present invention is adapted to a so-called immersion exposure apparatus wherein a liquid is locally filled between the projection optical system and the substrate, which is exposed through the liquid, and such an immersion exposure apparatus is disclosed in PCT International Publication WO 99/49504. Furthermore, the present invention can also be adapted to an immersion exposure apparatus that performs exposure in a state wherein the entire front surface of the substrate to be exposed is immersed in a liquid, as disclosed in, for example, Japanese Patent Application, Publication No. H 6-124873A, Japanese Patent Application, Publication No. H10-303114A, and U.S. Pat. No. 5,825,043.

In addition, each of the embodiments discussed above explained an exemplary case of an exposure apparatus that is provided with the projection optical system PL, but the present invention can be adapted to an exposure apparatus and an exposing method that do not use the projection optical system PL. Thus, even if the projection optical system PL is not used, the exposure light is radiated onto the substrate through optical members, e.g., lenses, and an immersion space is formed in a prescribed space between the substrate and those optical members.

In addition, the present invention can also be adapted to a twin stage type exposure apparatus, which is provided with a plurality of substrate stages (wafer stages). The structure and exposure operation of a twin stage type exposure apparatus is disclosed in, for example, Japanese Patent Application, Publication No. H10-163099A, Japanese Patent Application, Publication No. H10-214783A (corresponding U.S. Pat. Nos. 6,341,007, 6,400,441, 6,549,269, and 6,590,634), Published Japanese Translation No. 2000-505958 of the PCT International Publication (corresponding U.S. Pat. No. 5,969,441), or U.S. Pat. No. 6,208,407. Furthermore, the present invention can also be adapted to the wafer stage of Japanese Patent Application No. 2004-168481A, which was previously filed by the applicants of the present application.

In addition, instead of providing a plurality of wafer stages, the present invention can also be adapted to an exposure apparatus that is provided with a substrate stage that holds the substrate, and a measurement stage that measures exposure-related information and whereon a fiducial member (wherein a fiducial mark is formed) and various photoelectric sensors are mounted, as disclosed in Japanese Patent Application, Publication No. H11-135400A and Japanese Patent Application, Publication No. 2000-164504.

In addition to a step-and-scan type scanning type exposure apparatus (a scanning stepper) that scans and exposes the pattern of a mask by synchronously moving the reticle R, which serves as the mask, and the wafer W, which serves as the substrate, the exposure apparatus 100 can also be adapted to a step-and-repeat type projection exposure apparatus (a stepper) that performs a full-field exposure of the pattern of the mask in a state wherein the mask and the substrate are stationary, and then sequentially steps the substrate.

Furthermore, when performing an exposure with a step-and-repeat system, the projection optical system may be used to transfer a reduced image of a first pattern onto the substrate in a state wherein the first pattern and the substrate are substantially stationary, and then to perform a full-field exposure of the substrate wherein a reduced image of a second pattern partially superposes the first pattern (as in a stitching type full-field exposure apparatus) in a state wherein the second pattern and the substrate are substantially stationary. In addition, the stitching type exposure apparatus can also be adapted to a step-and-stitch type exposure apparatus that transfers at least two patterns onto the substrate so that they partially overlap, and sequentially steps the wafer.

The type of exposure apparatus 100 is not limited to a semiconductor device fabrication exposure apparatus that exposes the substrate with the pattern of a semiconductor device, but can also be widely adapted to an exposure apparatus that is used for fabricating, for example, liquid crystal display devices or displays, and an exposure apparatus that is used for fabricating thin film magnetic heads, image capturing devices (CCDs), micromachines, MEMS, DNA chips, or reticles and masks.

Furthermore, in the embodiments discussed above, a light transmitting type mask is used wherein a prescribed shielding pattern (or a phase pattern or a dimming pattern) is formed on a light transmitting substrate; however, instead of such a mask, it is also possible to use an electronic mask wherein a transmittance pattern, a reflected pattern, or a light emitting pattern is formed based on electronic data of the pattern to be exposed, as disclosed in, for example, U.S. Pat. No. 6,778,257; here, electronic masks, which are also called variable forming masks, include, for example, a digital micromirror device (DMD), which is one type of a non light emitting image display device (spatial light modulator).

In addition, by forming interference fringes on the substrate as disclosed in, for example, PCT International Publication WO2001/035168, the present invention can also be adapted to an exposure apparatus (a lithographic system) that exposes the substrate with a line-and-space pattern.

In addition, the present invention can also be adapted to, for example, an exposure apparatus that exposes a substrate with the combination of the patterns of two masks through a projection optical system, and double exposes, substantially simultaneously, a single shot region on the substrate using a single scanning exposure, as disclosed in, for example, Published Japanese Translation No. 2004-519850 of the PCT International Publication (corresponding U.S. Pat. No. 6,611, 316). In addition, the present invention can also be adapted to, for example, a proximity type exposure apparatus and a mirror projection aligner.

The exposure apparatus 100 of the above-described embodiments is manufactured by assembling various subsystems, including each constituent element, so that a prescribed mechanical accuracy, electrical accuracy, and optical accuracy are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus 10 from the various subsystems includes, for example, the mechanical interconnection of the various subsystems, the wiring and connection of electrical circuits, and the piping and connection of the atmospheric pressure circuit. Naturally, prior to performing the process of assembling the exposure apparatus 10 from these various subsystems, there are also the processes of assembling each individual subsystem. When the process of assembling the exposure apparatus 10 from the various subsystems is complete, a comprehensive adjustment is performed to ensure the various accuracies of the exposure apparatus 10 as a whole. Furthermore, it is preferable to manufacture the exposure apparatus 10 in a clean room wherein, for example, the temperature and the cleanliness level are controlled.

Figure 14:
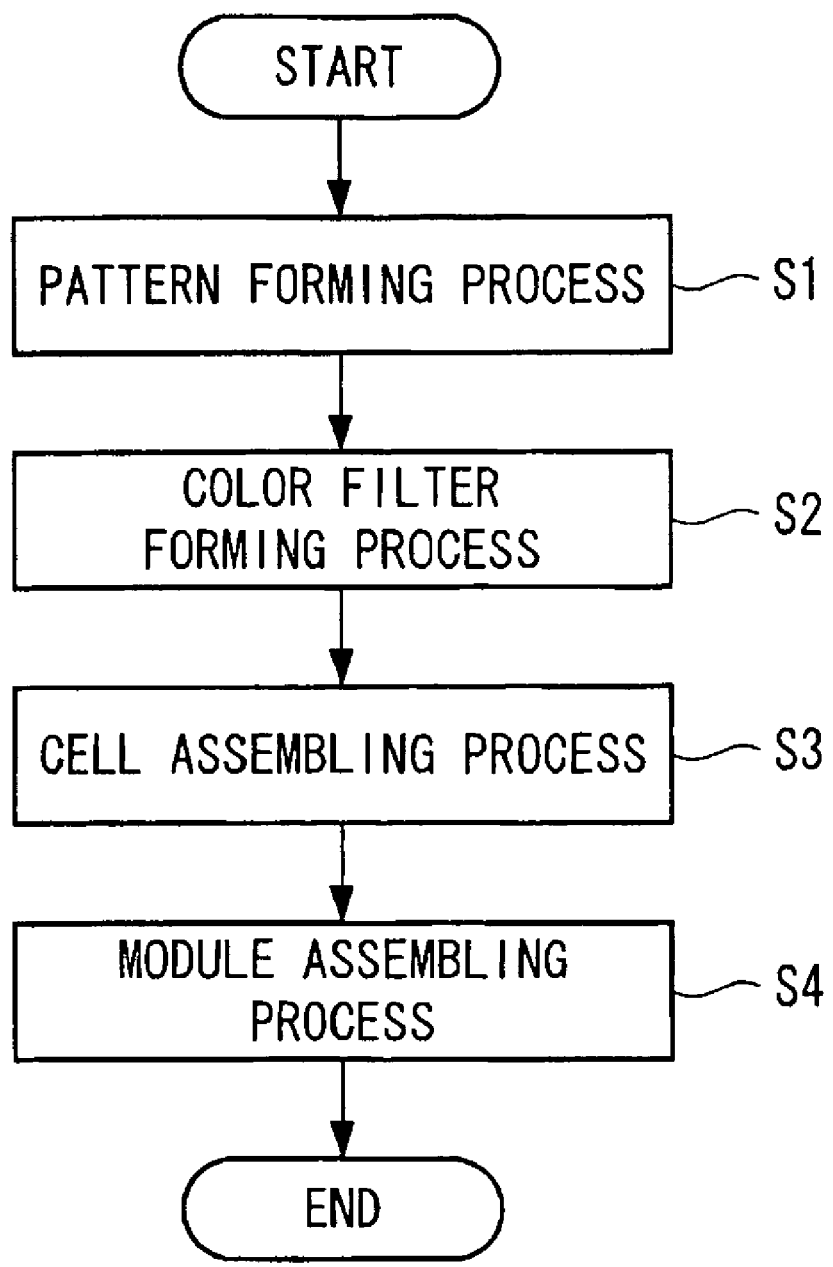
FIG. 14 is a flow chart that shows part of a process that fabricates liquid crystal display devices, which serve as microdevices.

Next, a method of fabricating a liquid crystal display device using the exposure apparatus according to one embodiment of the present invention will be explained. FIG. 14 is a flow chart that shows part of a fabricating process that fabricates a liquid crystal display device, which serves as a microdevice. In a pattern forming process S1 in FIG. 14, a so-called photolithographic process is performed wherein the exposure apparatus in the present embodiment is used to expose the wafer W by transferring the pattern of the mask onto the wafer W. In this photolithographic process, a prescribed pattern that includes, for example, numerous electrodes is formed on the wafer W. Subsequently, the exposed wafer W undergoes various processes, e.g., a developing process, an etching process, and a stripping process, and thereby the prescribed pattern is formed on the wafer W, after which the method transitions to the succeeding color filter forming process S2.

In the color filter forming process S2, a color filter is formed wherein numerous groups of three dots corresponding to R (red), G (green), and B (blue) are arrayed in a matrix, or a plurality of groups of filters, each filter comprising three stripes (R, G, B), are arrayed in the horizontal scanning line directions.

Furthermore, after the color filter forming process S2, a cell assembling process S3 is performed. In this cell assembling process S3, a liquid crystal panel (comprising liquid crystal cells) is assembled using, for example, the wafer W that has the prescribed pattern that was obtained in the pattern forming process S1 and the color filter that was obtained in the color filter forming process S2.

In the cell assembling process S3, the liquid crystal panel (the liquid crystal cells) is fabricated by, for example, injecting liquid crystal between the wafer W, which has the prescribed pattern that was obtained in the pattern forming process S1, and the color filter, which was obtained in the color filter forming process S2. Subsequently, in a module assembling process S4, the liquid crystal display device is completed by attaching various parts, such as a back light and an electrical circuit that operates the display of the assembled liquid crystal panel (the liquid crystal cells). The method of fabricating liquid crystal display devices discussed above can obtain liquid crystal display devices that have extremely fine patterns with good throughput.

Figure 15:
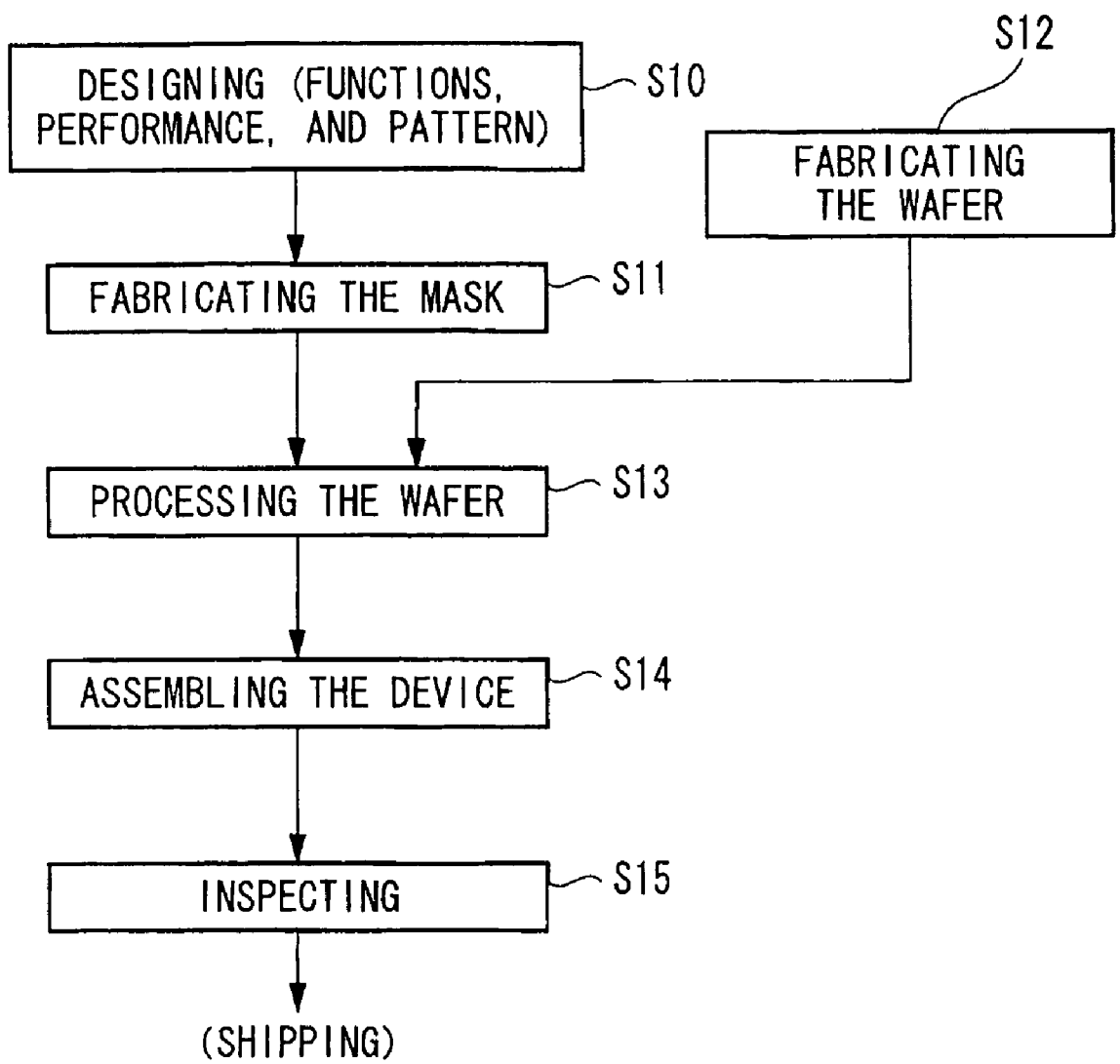
FIG. 15 is a flow chart that shows part of a process that fabricates semiconductor devices, which serve as microdevices.

The following explains a method that adapts the exposure apparatus according to the embodiments of the present invention to an exposure apparatus that fabricates semiconductor devices, and then uses such to fabricate semiconductor devices. FIG. 15 is a flow chart that shows part of a process that fabricates semiconductor devices, which serve as microdevices. As shown in FIG. 15, first, in step S10 (a designing step), the functions and performance of the semiconductor device are designed, and patterns to implement those functions are designed. Continuing, in step S11 (a mask fabricating step), the mask (or reticle), wherein the designed pattern is formed, is fabricated. Moreover, in step S12 (a wafer fabricating step), the wafer is fabricated using a material such as silicon.

Next, in step S13 (a wafer processing step), the actual circuit and the like are formed on the wafer by, for example, lithographic technology (discussed later) using the mask and the wafer that were prepared in steps 10-S12. Continuing, in step S14 (a device assembling step), the device is assembled using the wafer that was processed in step S13. In step S14, processes are included as needed, such as the dicing, bonding, and packaging (chip encapsulating) processes. Lastly, in step S15 (an inspecting step), inspections are performed, e.g., an operation verification test and a durability test of the microdevice fabricated by step S14. Finishing such processes completes the fabrication of the microdevice, which is then shipped.

In addition to fabricating microdevices such as liquid crystal display devices and semiconductor devices, the present invention can also be adapted to an exposure apparatus that transfers a pattern from a mother reticle to a glass substrate, a silicon wafer, or the like in order to fabricate a reticle or a mask used by a visible light exposure apparatus, an EUV exposure apparatus, an X ray exposure apparatus, an electron beam exposure apparatus, and the like. Here, a light transmitting type reticle is generally used in an exposure apparatus that uses deep ultraviolet (DUV) light, vacuum ultraviolet (VUV) light, and the like; in addition, quartz glass, quartz glass doped with fluorine, fluorite, magnesium fluoride, quartz, and the like are used for the reticle substrate. In addition, a light transmitting type mask (a stencil mask or a membrane mask) is used with a proximity type X-ray exposure apparatus, an electron beam exposure apparatus, or the like, and a silicon wafer or the like is used for the mask substrate. Furthermore, such an exposure apparatus is disclosed in PCT International Publication WO99/34255, PCT International Publication WO99/50712, PCT International Publication WO99/66370, Japanese Patent Application, Publication Nos. H11-194479A, 2000-12453A, 2000-29202A, and the like.

What is claimed is:

1. A pellicle frame apparatus wherein a pellicle is provided to one end surface of end surfaces of a frame, and an other end surface of the end surfaces of the frame has an opposing area that opposes a substrate, the pellicle frame apparatus comprising:
    a configuration that is capable of preventing a deformation of the one end surface of the frame and a shape of the opposing area on the other end surface from affecting one another;
    the opposing area comprises:
        a first area that is provided with a prescribed value of flexural rigidity with respect to the substrate; and
        a second area that is provided with a flexural rigidity with respect to the substrate, the value of which is smaller than that of the first area;
    the frame has a plurality of sides on three of which the first area is disposed;
    the first area and the second area are provided so as to be in contact with the substrate;
    the first area is disposed on a first side, a second side, and a third side, wherein the second side and third side are connected to the first side; and
    a slit is formed in the frame at the second area and between the end surface on the one side and the contact part of the substrate.

2. A pellicle frame apparatus according to claim 1, wherein a second filter member is provided that is permeable and that captures foreign matters, which are about to pass towards an interior of the frame via the slit.

3. A pellicle frame apparatus according to claim 2, wherein the second filter member is a porous member that is disposed in the slit.

4. A pellicle frame apparatus according to claim 2, wherein the second filter member is a sheet shaped cover member that covers the slit.

5. A pellicle frame apparatus according to claim 4, wherein the second filter member is provided in a second recess, which is provided on the frame along the slit.

6. A pellicle frame apparatus wherein a pellicle is provided to one end surface of end surfaces of a frame, and another end surface of the end surfaces of the frame has an opposing area that opposes a substrate, the pellicle frame apparatus comprising:
    a configuration that is capable of preventing a deformation of the one end surface of the frame and the shape of the opposing area on the other end surface from affecting one another;
    the frame is formed substantially as a rectangle;
    the frame has a plurality of sides on three of which a first area with a prescribed value of flexural rigidity with respect to the substrate is disposed;
    the frame has a second area with a prescribed value of flexural rigidity with respect to the substrate smaller than the prescribed value of flexural rigidity of the first area with respect to the substrate; and
    the first area is disposed on a first side, a second side, and a third side, wherein the second side and the third side are connected to the first side.

7. A pellicle frame apparatus according to claim 6, wherein a filter member is provided that is permeable and that captures foreign matters, which are about to pass towards an interior of the frame via a gap between the second area and the substrate.

8. A pellicle frame apparatus according to claim 7, wherein the filter member is a porous member that is disposed in the gap.

9. A pellicle frame apparatus according to claim 7, wherein the filter member is a sheet shaped cover member that covers the gap.

10. A pellicle frame apparatus according to claim 9, wherein the filter member is provided in a recess, which is provided on the frame along the gap.

11. A mask wherein a pattern is formed on a substrate, comprising:
a pellicle frame apparatus according to claim 6 provided to the substrate.

12. An exposing method, comprising:
holding a mask according to claim 11 to a mask stage; and
exposing a photosensitive substrate with the pattern of the mask.

13. An exposing method according to claim 12, wherein the exposure of the photosensitive substrate comprising synchronously moving the mask and the photosensitive substrate, and
the first area has a plurality of areas that are disposed so that the areas have line symmetry with respect to an axis that is parallel to the synchronous movement direction.

14. A device fabricating method that has an exposure process, wherein
an exposing method according to claim 12 is used when performing the exposure process.

15. An exposure apparatus that exposes a substrate with a pattern that is formed on a mask, comprising:
a holding apparatus that holds a mask according to claim 11, the holding apparatus having a holding member that is capable of being transformed so as to conform with the shape of a held surface of the mask.

16. A pellicle frame apparatus for use with a pellicle, the pellicle frame apparatus comprising:
a plurality of sides;
a substrate on one side of the plurality of sides;
a first area with a prescribed value of flexural rigidity with respect to the substrate;
a second area with a prescribed value of flexural rigidity that is smaller than the prescribed value of flexural rigidity of first area with respect to the substrate;
three of the plurality of sides having a first area, respectively;
the first area of the three of the plurality of sides makes contact with and is fixed to the substrate;
the first area is disposed on a first side, a second side, and a third side, wherein the second side and the third side are connected to the first side; and
the first area of three of the plurality of sides forms vertices of a substantially isosceles triangle.

17. A pellicle frame that is fixed to a mask and is used in an exposure apparatus to protect a pattern formed on the mask, the pellicle frame comprising:
a pellicle that faces the pattern; and
a frame member that is formed in a rectangular shape having four sides, the four sides supporting the pellicle, wherein
the frame member has a continuous surface with a first end that is furthest from the mask when the pellicle frame is fixed to the mask and a second end that is closest to the mask when the pellicle frame is fixed to the mask,
the frame member has three fixed portions that are fixed to the mask and has non-fixed portions that are between the fixed portions,
the three fixed portions are respectively provided at three different sides among the four sides, and
a distance between the first end and the second end of the surface is greater at the fixed portions than at the non-fixed portions so that the fixed portions extend toward the mask beyond the non-fixed portions.

18. The pellicle frame according to Claim 17, wherein the frame member further has an opposing surface that opposes the mask via a gap in a state where the fixed portions and the mask are fixed.

19. A mask comprising:
a substrate on which the pattern is formed; and
the pellicle frame according to claim 18, the pellicle frame being fixed to the substrate.

20. The mask according to claim 19, further comprising:
a filter member that captures foreign matter which is about to pass towards an interior of the frame via the gap.

21. An exposure method comprising:
transferring the mask according to claim 19 to a mask stage; and
exposing a photosensitive substrate with the pattern.

22. A device fabricating method comprising an exposure process that includes the exposure method according to claim 21.

23. A pellicle frame that is fixed to a mask and is used in an exposure apparatus to protect a pattern formed on the mask, the pellicle frame comprising:
a pellicle that faces the pattern; and
a frame member that comprises:
a first part having a frame shape and having a first surface that is fixed to the mask; and
a second part having a frame shape and having a second surface to which the pellicle is fixed, the first part and the second part being connected to each other at three different points, wherein
each of the first and second parts has a side surface that extends from a first end that is closest to the first surface to a second end that is closest to the second surface, and
the side surfaces of the first and second parts jointly form a groove that extends continuously around the frame member.

24. The pellicle frame according to claim 23, wherein the first part and the second part are each formed in a rectangular shape having four sides, and the first part and the second part are connected to each other at the three different points, the three different points being provided respectively at three different sides among the four sides.

25. The pellicle frame according to claim 23, wherein the frame member further comprises slits disposed between the first part and the second part, each slit extending along a circumferential direction of the frame member.

26. The pellicle frame according to claim 25, further comprising:
a filter member that captures foreign matter which is about to pass towards an interior of the frame member via the slit.

27. The pellicle frame according to claim 26, wherein the filter member comprises a porous member that is disposed at the slit.

28. The pellicle frame according to claim 26, wherein the filter member comprises a cover member that covers the slit.

29. A mask comprising:
a substrate on which the pattern is formed; and
the pellicle frame according to claim 23, the pellicle frame being fixed to the substrate.

30. An exposure method comprising:
transferring the mask according to claim 29 to a mask stage; and
exposing a photosensitive substrate with the pattern.

31. A device fabricating method comprising an exposure process that includes the exposure method according to claim 30.

* * * * *